(12) United States Patent
Kobayashi et al.

(10) Patent No.: US 11,355,317 B2
(45) Date of Patent: Jun. 7, 2022

(54) METHODS AND APPARATUS FOR DYNAMICAL CONTROL OF RADIAL UNIFORMITY IN MICROWAVE CHAMBERS

(71) Applicant: APPLIED MATERIALS, INC., Santa Clara, CA (US)

(72) Inventors: Satoru Kobayashi, Santa Clara, CA (US); Lance Scudder, Sunnyvale, CA (US); David Britz, San Jose, CA (US); Soonam Park, Sunnyvale, CA (US); Dmitry Lubomirsky, Cupertino, CA (US); Hideo Sugai, A'ichi (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/218,848

(22) Filed: Dec. 13, 2018

(65) Prior Publication Data

US 2019/0189399 A1 Jun. 20, 2019

Related U.S. Application Data

(60) Provisional application No. 62/598,773, filed on Dec. 14, 2017.

(51) Int. Cl.
*H01J 37/32* (2006.01)
*H01L 21/67* (2006.01)

(52) U.S. Cl.
CPC ..... *H01J 37/32311* (2013.01); *H01J 37/3222* (2013.01); *H01J 37/32201* (2013.01); *H01J 37/32229* (2013.01); *H01L 21/67017* (2013.01); *H01J 2237/3341* (2013.01)

(58) Field of Classification Search
CPC .. H01J 65/044; H01J 49/022; H01J 37/32174; H01J 37/32082; H01J 49/025; H01J 37/32183; H01J 37/3222; H01J 37/3299; H01J 43/246
See application file for complete search history.

(56) References Cited

U.S. PATENT DOCUMENTS

| | | | |
|---|---|---|---|
| 5,302,803 A | 4/1994 | Stevens et al. | |
| 5,632,921 A | 5/1997 | Risman et al. | |
| 5,886,473 A * | 3/1999 | Watanabe | H01J 37/32238 315/111.21 |
| 5,954,882 A * | 9/1999 | Wild | H01J 37/32192 118/723 MW |

(Continued)

OTHER PUBLICATIONS

Yuichi Hasegawa, et al., "Microwave Plasma Generation by the Fast Rotation and Slow Pulsation of Resonant Fields in a Cylindrical Cavity", Japanese Journal of Applied Physics 56, (2017), pp. 046203-046203-7.

(Continued)

*Primary Examiner* — Wei (Victor) Y Chan
(74) *Attorney, Agent, or Firm* — Moser Taboada

(57) ABSTRACT

Plasma is generated in a semiconductor process chamber by a plurality of microwave inputs with slow or fast rotation. Radial uniformity of the plasma is controlled by regulating the power ratio of a center-high mode and an edge-high mode of the plurality of microwave inputs into a microwave cavity. The radial uniformity of the generated plasma in a plasma chamber is attained by adjusting the power ratio for the two modes without inputting time-splitting parameters for each mode.

12 Claims, 31 Drawing Sheets

(56) References Cited

U.S. PATENT DOCUMENTS

| | | | |
|---|---|---|---|
| 6,020,580 A | 2/2000 | Lewis et al. | |
| 9,299,537 B2 | 3/2016 | Kobayashi et al. | |
| 2008/0246385 A1* | 10/2008 | Schamiloglu | H01J 23/05 |
| | | | 313/62 |
| 2012/0045863 A1* | 2/2012 | Hopwood | C23C 16/545 |
| | | | 438/57 |
| 2012/0186747 A1 | 7/2012 | Obama et al. | |
| 2014/0220261 A1* | 8/2014 | Asmussen | C30B 25/105 |
| | | | 427/570 |
| 2015/0270105 A1* | 9/2015 | Kobayashi | H01J 37/3299 |
| | | | 315/34 |
| 2016/0284519 A1 | 9/2016 | Kobayashi et al. | |
| 2016/0358750 A1* | 12/2016 | Ikeda | H01J 37/3222 |
| 2017/0125219 A1 | 5/2017 | Kobayashi et al. | |
| 2017/0263421 A1* | 9/2017 | Ikeda | H01J 37/32266 |
| 2018/0226230 A1 | 8/2018 | Kobayashi et al. | |

OTHER PUBLICATIONS

Masaya Hotta, et al., "Generation of Slowly Rotating Microwave Plasma by Amplitude-Modulated Resonant Cavity", Japanese Journal of Applied Physics 56, (2017), pp. 116002-1-116002-8.

\* cited by examiner

← 1300A $$\frac{\Omega_i}{2\pi} = 1 - 10000 \text{ Hz}$$

| | Carrier Frequency $f_i = \omega_i/2\pi$ (GHz) | Set-A | Set-B |
|---|---|---|---|
| $TE_{111}$ | 2.425 | $V_1 \cos\Omega_1 t \cdot \cos\omega_1 t$ | $V_1 \cos(\Omega_1 t - \frac{\pi}{2}) \cdot \cos\omega_1 t$ |
| $TE_{311}$ | 2.486 | $V_3 \cos\Omega_3 t \cdot \cos\omega_3 t$ | $V_3 \cos(\Omega_3 t + \frac{\pi}{2}) \cdot \cos\omega_3 t$ |

FIG. 13A

← 1300B $$\frac{\Omega_i}{2\pi}$$

| | Carrier Frequency $f_i = \omega_i/2\pi$ (GHz) | Set-A | Set-B |
|---|---|---|---|
| $TE_{111}$ | 2.425 | $V_1 \cdot \cos\omega_1 t$ | $V_1 \cdot \cos(\omega_1 t - \frac{\pi}{2})$ |
| $TE_{311}$ | 2.486 | $V_3 \cdot \cos\omega_3 t$ | $V_3 \cdot \cos(\omega_3 t + \frac{\pi}{2})$ |

FIG. 13B

← 2300A $$\frac{\Omega_i}{2\pi} = 1 - 10000 \text{ Hz}$$

| | Carrier Frequency $f_i = \omega_i/2\pi$ (GHz) | Set-A | Set-B or B' |
|---|---|---|---|
| $TE_{111}$ | 2.425 | $V_1 \cos\Omega_1 t \cdot \cos\omega_1 t$ | $V_1 \cos(\Omega_1 t - \frac{\pi}{2}) \cdot \cos\omega_1 t$ |
| $TE_{211}$ | 2.450 | $V_2 \cos\Omega_2 t \cdot \cos\omega_2 t$ | $V_2 \cos(\Omega_2 t - \frac{\pi}{2}) \cdot \cos\omega_2 t$ |

FIG. 23A

← 2300B $$\frac{\omega_i}{2\pi}$$

| | Carrier Frequency $f_i = \omega_i/2\pi$ (GHz) | Set-A | Set-B or B' |
|---|---|---|---|
| $TE_{111}$ | 2.425 | $V_1 \cdot \cos\omega_1 t$ | $V_1 \cdot \cos(\omega_1 t - \frac{\pi}{2})$ |
| $TE_{211}$ | 2.450 | $V_2 \cdot \cos\omega_2 t$ | $V_2 \cdot \cos(\omega_2 t - \frac{\pi}{2})$ |

FIG. 23B

METHODS AND APPARATUS FOR DYNAMICAL CONTROL OF RADIAL UNIFORMITY IN MICROWAVE CHAMBERS

CROSS-REFERENCE TO RELATED APPLICATIONS

This application claims the benefit of U.S. provisional patent application Ser. No. 62/598,773, filed Dec. 14, 2017, which is herein incorporated by reference in its entirety.

FIELD

Embodiments of the present principles generally relate to semiconductor processes, and specifically to microwave plasma chambers.

BACKGROUND

Semiconductor process chambers are used to deposit and etch materials onto a substrate, often using plasma to assist with the deposition and the etching of the materials. Microwave plasma systems use microwaves to create and maintain the plasma during the semiconductor processes. The most commonly used plasma systems use a radio frequency (RF) of 13.56 MHz for excitation. Microwave systems, however, are usually excited at 2.450 GHz. Early microwave plasma systems suffered from frequency and power instability, making the systems hard to excite with poor uniformity during production. Because microwave-based systems produce much higher radical densities compared to 13.56 MHz RF plasma systems, the microwave-based systems are still desirable for use in the semiconductor industry. However, uniformity of the plasma in a microwave-based system has been a significant problem.

Thus, the inventors have provided an improved method and apparatus for controlling uniformity of plasma in a microwave-based semiconductor processing system.

SUMMARY

A dynamical control of the radial uniformity in a microwave cavity chamber that allows a radially uniform etching/deposition to be attained by adjusting only the power ratios of two microwave modes of center-high and edge-high inside the microwave cavity. Monitoring and control of time-splitting between the center-high and edge-high modes is eliminated, significantly simplifying the production of uniform plasma in the microwave chamber. A uniform plasma generally yields improved deposition or etch performance on the wafer/substrate during semiconductor processes. Example performance benefits of improved plasma uniformity include: improved deposition/etch uniformity, reduced film stresses, more precise average deposition/etch thickness, improved temperature uniformity, etc. The benefits in deposition/etch layer quality will often translate to improved device performance and yield.

In some embodiments, a system for generating plasma for a semiconductor process comprises a process chamber having a microwave cavity for producing plasma; at least one microwave input connected to the microwave cavity; a microwave signal generator connected to the microwave cavity via at least one set of an amplifier and a tuner; the microwave signal generator supplying a plurality of microwave signals to the at least one microwave input; and a microwave power controller interfacing with the microwave signal generator to adjust a power ratio between at least two of the plurality of microwave signals such that plasma generated by the plurality of microwave signals is radially uniform.

In some embodiments, the system may further comprise a feedback controller connected to the process chamber to detect at least one microwave signal in the microwave cavity, wherein the microwave signal generator creates a first microwave signal from a first mode and a second mode and a second microwave signal from the first mode and the second mode, wherein the microwave signal generator alternately pulses the first microwave signal and the second microwave signal, wherein the first mode is one of an edge-high mode and a center-high mode and the second mode is one of an edge-high mode and a center-high mode, wherein the microwave signal generator creates at least one of the first microwave signal and the second microwave signal from at least one edge-high mode and at least one center-high mode, wherein the microwave signal generator is connected to a plurality of microwave inputs of the microwave cavity via a plurality of sets of amplifiers and tuners and supplies a plurality of microwave signals to the plurality of microwave inputs and wherein the microwave power controller interfaces with the microwave signal generator to adjust a power ratio between at least two of the plurality of microwave signals such that plasma generated by the plurality of microwave inputs is radially uniform, a feedback controller connected to the process chamber to detect at least one microwave signal in the microwave cavity, a microwave power combiner connected between a plurality of amplifiers and a tuner, wherein the microwave signal generator creates at least one first microwave signal from at least one of a first mode and a second mode and at least one second microwave signal from at least one of a first mode and a second mode, wherein the first mode is one of an edge-high mode and a center-high mode and the second mode is one of an edge-high mode and a center mode, and/or wherein the microwave signal generator creates at least one microwave signal from at least one edge-high mode and at least one center-high mode.

In some embodiments, a method of controlling plasma generation in a semiconductor process chamber comprises generating a first microwave signal with a first mode that forms plasma in a microwave cavity in the semiconductor process chamber; generating a second microwave signal with a second mode that forms plasma in the microwave cavity in the semiconductor process chamber; generating a third microwave signal with a first temporal phase difference from the first microwave signal; generating a fourth microwave signal with a second temporal phase difference from the second microwave signal; and injecting the first microwave signal and the second microwave signal in combination into a first port of the microwave cavity while injecting the third and fourth microwave signal in combination into a second port of the microwave cavity, wherein the first port and the second port have a spatial angle calculated from mode rotation theory.

In some embodiments, the method may further comprise adjusting a power ratio between associated microwave signals of the first port and associated microwave signals of the second port such that plasma generated in the semiconductor process chamber is radially uniform, generating the first microwave signal with the first mode being an edge-high mode or a center-high mode and generating the second microwave signal with the second mode being an edge-high mode or a center-high mode, and/or wherein the spatial angle is approximately equal to an absolute value of the first temporal phase difference or an absolute value of the second temporal phase difference.

In some embodiments, a method of controlling plasma generation in a semiconductor process chamber comprises generating a first microwave signal with a first mode that forms plasma in a microwave cavity in the semiconductor process chamber; generating a second microwave signal with a second mode that forms plasma in the microwave cavity in the semiconductor process chamber; generating a third microwave signal with a first temporal phase difference from the first microwave signal; generating a fourth microwave signal with a second temporal phase difference from the second microwave signal; and injecting the first microwave signal into a first port of the microwave cavity and injecting the second microwave signal into a second port of the microwave cavity while injecting the third microwave signal into a third port of the microwave cavity while injecting the fourth microwave signal into a fourth port, wherein the first port and the third port have a first spatial angle calculated from mode rotation theory and wherein the second port and the fourth port have a second spatial angle calculated from mode rotation theory.

In some embodiments, the method may further comprise generating the first microwave signal with the first mode being an edge-high mode or a center-high mode and generating the second microwave signal with the second mode being an edge-high mode or a center-high mode, wherein the first spatial angle is approximately equal to an absolute value of the first temporal phase difference and the second spatial angle is approximately equal to an absolute value of the second temporal phase difference, and/or adjusting a power ratio between associated microwave signals of the first port and the second port and associated microwave signals of the third port and the fourth port such that plasma generated in the semiconductor process chamber is radially uniform.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

FIG. 13A is a table illustrating slow rotation microwave signal inputs for a microwave cavity in accordance with some embodiments of the present principles.

FIG. 13B is a table illustrating fast rotation microwave signal inputs for a microwave cavity in accordance with some embodiments of the present principles.

FIG. 23A is a table illustrating slow rotation microwave signal inputs for a microwave cavity of the system of FIG. 22 in accordance with some embodiments of the present principles.

FIG. 23B is a table illustrating fast rotation microwave signal inputs for a microwave cavity of the system of FIG. 22 in accordance with some embodiments of the present principles.

Figure 1:
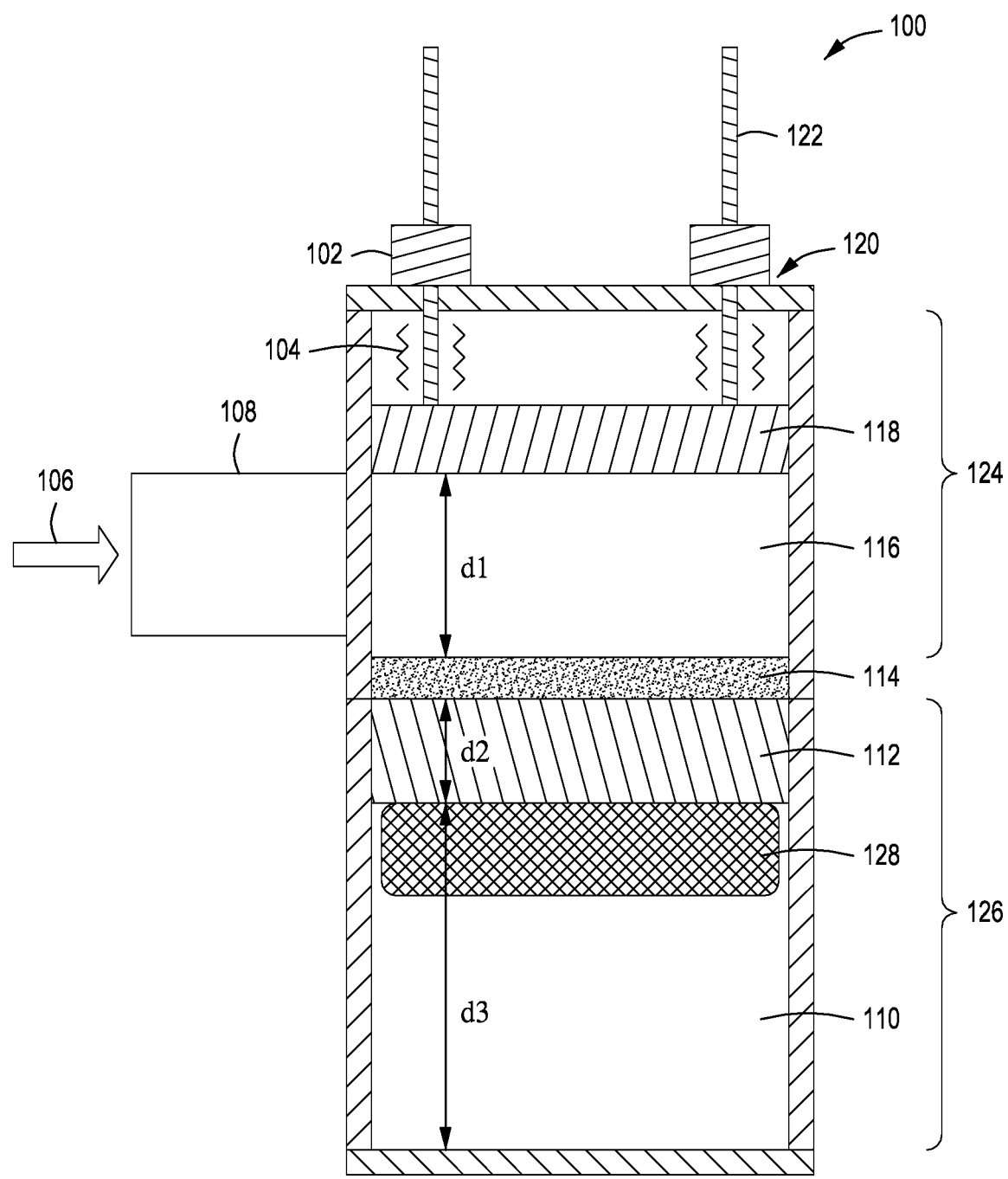
FIG. 1 is a schematic cross-sectional drawing illustrating a portion of a plasma processing system with a metallic bottom plate with radiation slots and with an adjustable ceiling plate within a waveguide cavity in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Excited eigenmodes in a cylindrical cavity have been shown to be rotatable by the inventors using two different methods. One of the two methods is the fast rotation method excited by phase differences in dual input configurations. The rotational frequency of which is equal to a radiation frequency of a microwave, e.g. 2.45 GHz. The fast rotation method is described in co-owned and co-pending USPTO patent application Ser. No. 14/221,132 filed on Mar. 20, 2014 and entitled, Radial Waveguide Systems and Methods for Post-Match Control of Microwaves and co-owned and co-pending USPTO patent application Ser. No. 15/180,425 filed on Jun. 13, 2016 and entitled, Generalized Cylindrical Cavity System for Microwave Rotation and Impedance Shifting by Irises in a Power-Supplying Waveguide. The second method is the slow rotation method excited by sinusoidal amplitude modulations, the rotational frequency of which is arbitrary, e.g. 1-10,000 Hz. The second rotation method is described in co-pending USPTO patent application Ser. No. 14/974,376 filed on Dec. 18, 2015 and entitled, Plasma Reactor Having Digital Control Over Rotation Frequency of a Microwave Field With Direct Up-conversion and co-pending USPTO patent application Ser. No. 15/424,488 filed on Feb. 3, 2015 and entitled, Systems and Methods for Radial and Azimuthal Control of Plasma Uniformity.

In a time-splitting control method for radial uniformity in a microwave cavity, such as that described in Systems and Methods for Radial and Azimuthal Control of Plasma Uniformity, a center-high mode is excited in a temporal interval in the cavity, making a center-high etching/deposition plasma. Thereafter, in another time-interval, an edge-high mode is excited, making an edge-high etching/deposition plasma to compensate for the preceding center-high edge mode. To attain the radially uniform etching/deposition effect on the wafer, an operator of the system manually controls not only the power ratio of the center-to-edge high modes, but also must control the time-splitting ratio of the two modes which is problematic. The inventors have discovered a dynamical control of the radial uniformity in a microwave cavity chamber that allows a radially uniform etching/deposition to be attained by adjusting only the power ratio of the two modes of center-high and edge-high. The inventors have also discovered that the radial uniformity of the plasma is advantageously maintained in high pressure environments, for example, up to 200 Torr.

Some embodiments of the dynamical control of the radial uniformity can be achieved, for example, in the process chambers shown in FIGS. 1-4. A microwave cavity 100 shown in FIG. 1 includes a top cavity 124 and a bottom cavity 126. The top cavity 124 further includes a metallic bottom plate with radiation slots 114, a cylindrical air cavity 116 with height d1, a movable ceiling plate 118, bellows 104, height adjusting poles 122 with height/level adjusting nuts 102 for moving the movable ceiling plate 118, and an outer cover 120. A power supplying waveguide 108 provides a microwave input 106 into the cylindrical air cavity 116. The bottom cavity 126 further includes a dielectric plate 112 with height d2, a plasma chamber 110 with height d3 and plasma 128.

Figure 2:
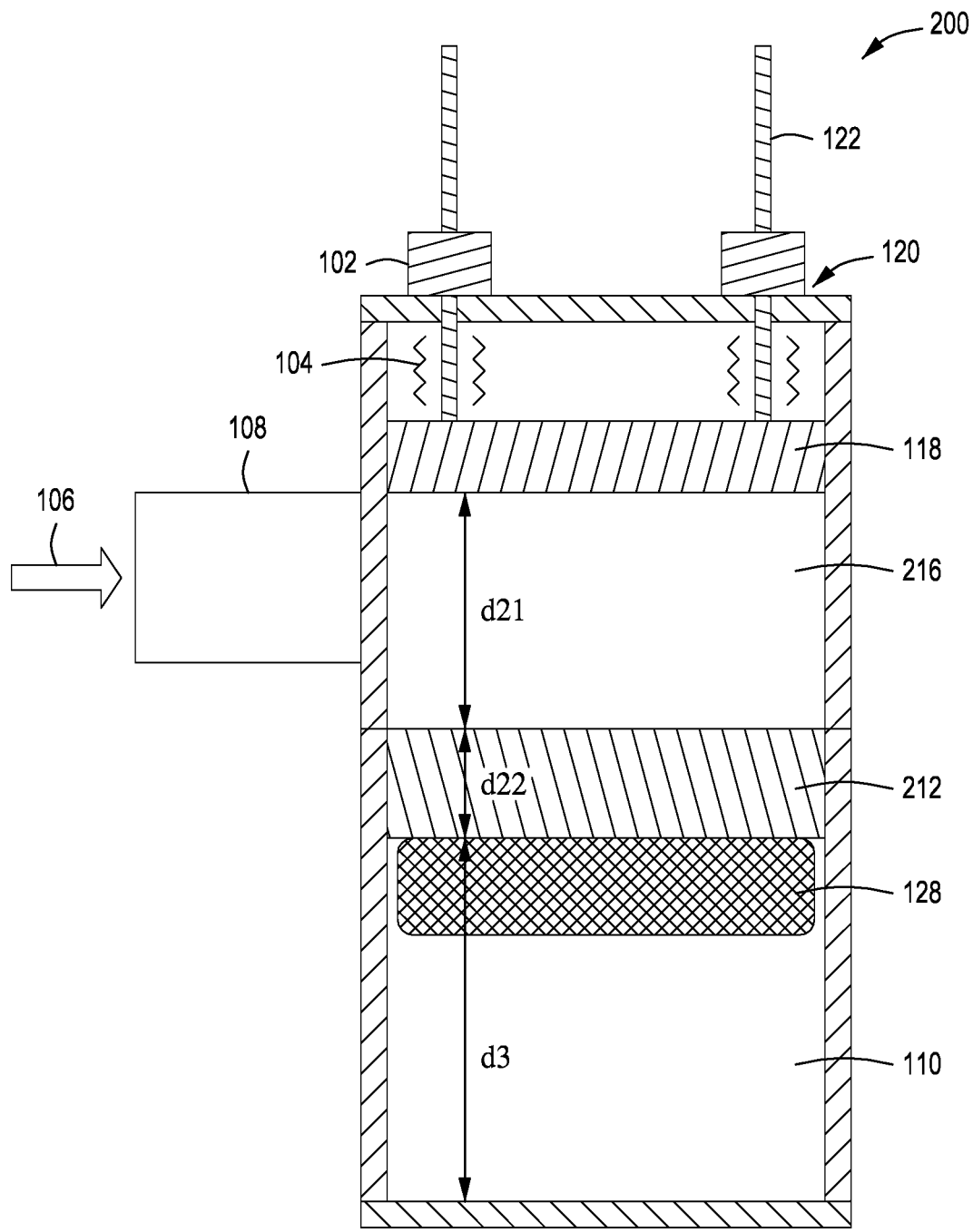
FIG. 2 is a schematic cross-sectional drawing illustrating a portion of a plasma processing system with an adjustable ceiling plate within a waveguide cavity in accordance with some embodiments of the present principles.
Figure 3:
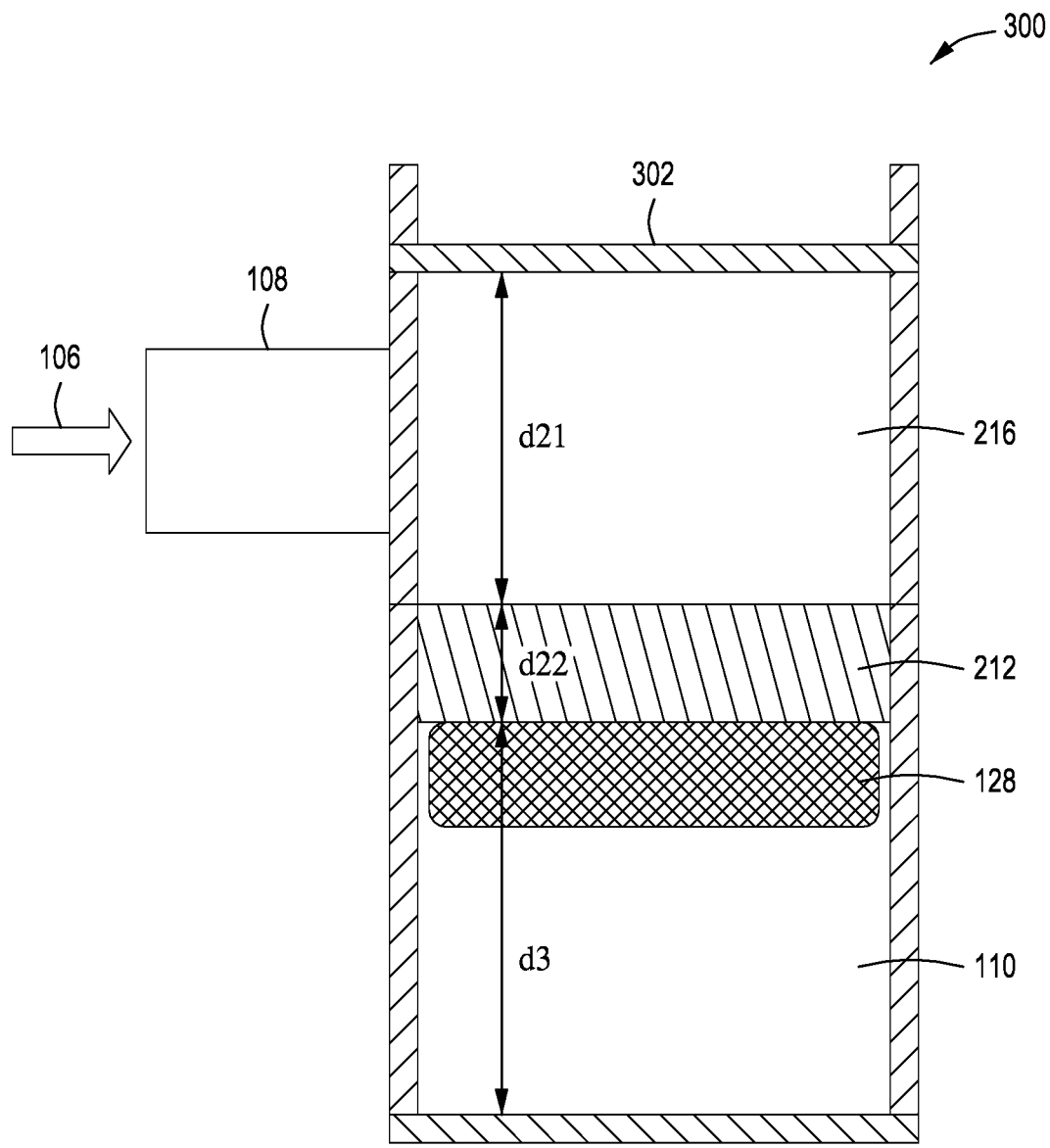
FIG. 3 is a schematic cross-sectional drawing illustrating a portion of a plasma processing system with an air gap cavity within a waveguide cavity in accordance with some embodiments of the present principles.
Figure 4A:
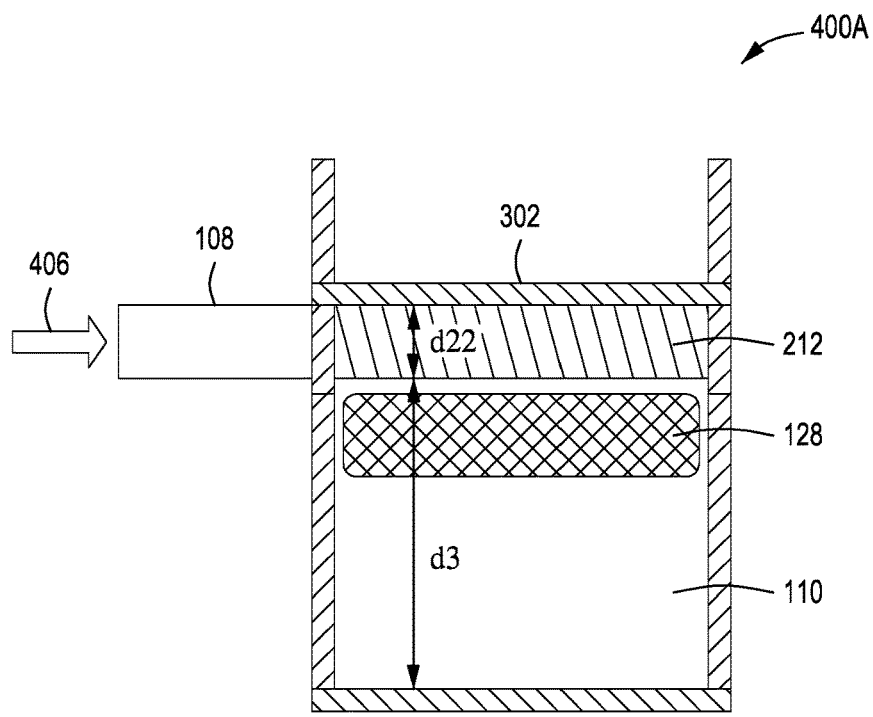
FIG. 4A is a schematic cross-sectional drawing illustrating a portion of a plasma processing system with a side entry microwave input to a waveguide cavity in accordance with some embodiments of the present principles.
Figure 4B:
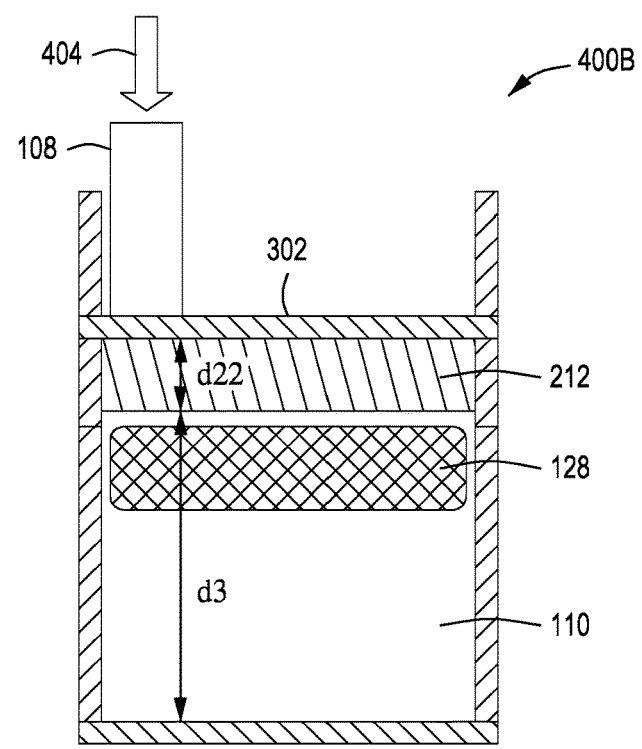
FIG. 4B is a schematic cross-sectional drawing illustrating a portion of a plasma processing system with a top entry microwave input to a waveguide cavity in accordance with some embodiments of the present principles.

A microwave cavity 200 shown in FIG. 2 is similar to FIG. 1 but without the metallic bottom plate with radiation slots 114. The cylindrical air cavity 216 of the microwave cavity 200 has a height d21, and the dielectric plate 212 of the microwave cavity 200 has a height of d22. A microwave cavity 300 of FIG. 3 is similar to FIG. 2, except a fixed ceiling plate 302 replaces the movable ceiling plate 118. Microwave cavities 400A, 400B of FIG. 4A and FIG. 4B, respectively, are similar to FIG. 3 except without the cylindrical air cavity 216. FIG. 4A includes a side microwave input 406 directed into the dielectric plate 212 and FIG. 4B includes a top microwave input 404 directed into the dielectric plate 212. The microwave cavities 200, 300, 400A, 400B of FIGS. 2-4 are advantageous with respect to simplicity of the microwave cavity as described below. In FIG. 3, the microwave inputs 106 are placed on the side wall of the microwave cavity 300. A connecting position of the microwave input 106 is anywhere in-between the cylindrical air cavity 216 and the dielectric plate 212. The microwave input 106 can also be inserted on the top of the microwave cavity 300 similar to the microwave cavity 400B of FIG. 4B.

Based on the Systems and Methods for Radial and Azimuthal Control of Plasma Uniformity patent, an assumption was made that the microwave resonance is satisfied mainly in the regions of height d2 of FIG. 1, heights d21+d22 in FIGS. 2 and 3, and height d22 in FIGS. 4A and 4B. However, the resonance can also be satisfied in the regions of heights d2+d3 of FIG. 1, heights d21+d22+d3 in FIGS. 2 and 3, and heights d22+d3 in FIGS. 4A and 4B. In the former cases, plasma 128 exits near the bottom of the dielectric plate 112 or 212 as shown in the figures. In the latter cases, plasma 128 will expand in the entire region of the plasma chamber 110 defined by a sinusoidal equation calculated from a given boundary condition. In the following paragraphs, only the former case will be considered for simplicity.

Figure 5:
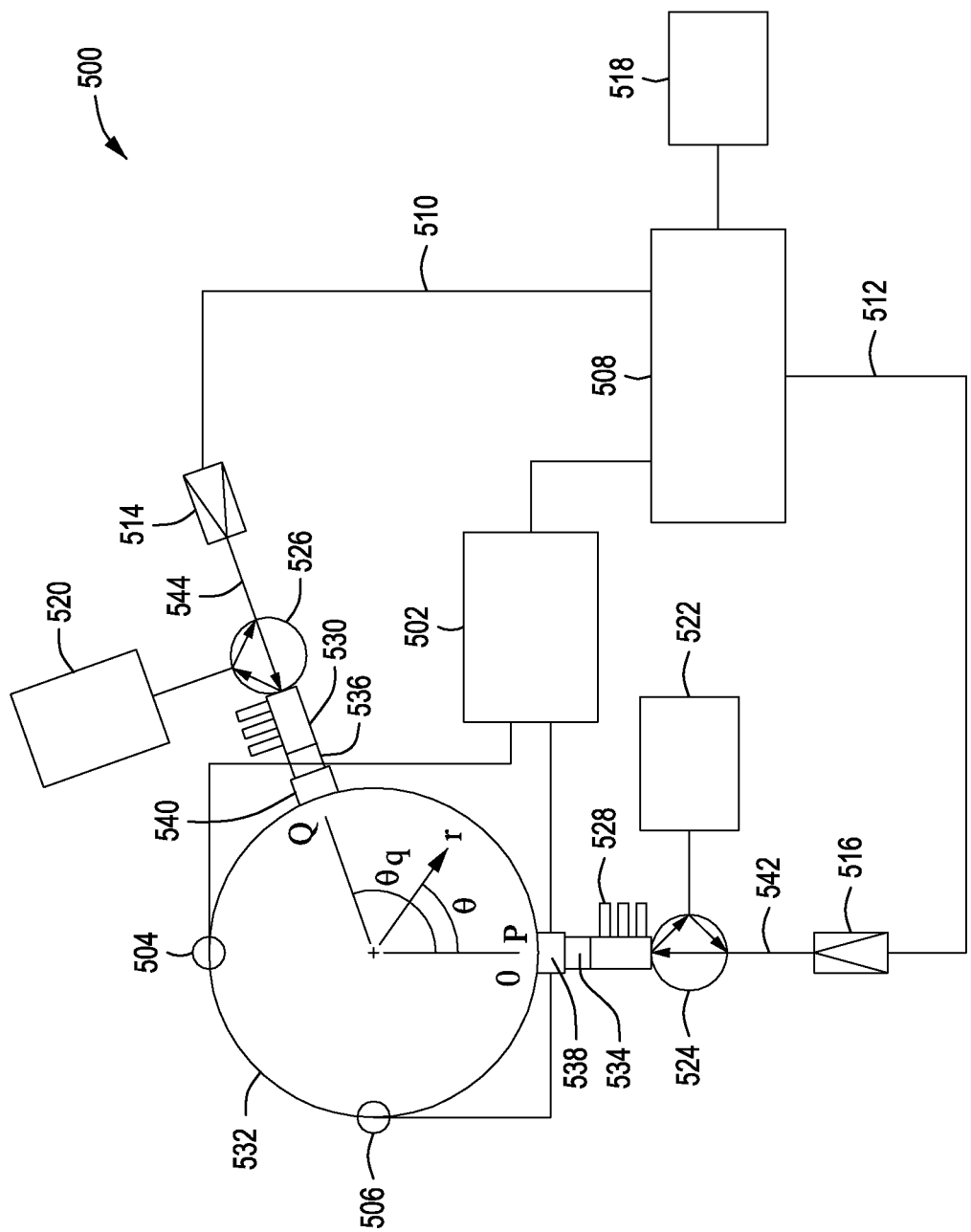
FIG. 5 is a schematic diagram illustrating components of a dual microwave input system with microwave antenna feedback for providing microwaves to a plasma chamber in accordance with some embodiments of the present principles.

In FIG. 5, a microwave input system 500 is shown with a feedback controller 502 according to some embodiments. The microwave input system 500 includes a user interface 518, dummy loads 520, 522, circulators 524, 526, stub-tuners 528, 530, a microwave cavity 532, coaxial to waveguide converters 534, 536, waveguides with radiation apertures 538, 540, and transmission lines or waveguides 542, 544. Optional monitoring antennas A 506 and B 504 provide microwave signals to the feedback controller 502 which are then fed into a microwave signal (phase and amplitude) generator 508. The microwave signal (phase and amplitude) generator 508 sends two seed signals 510, 512 to two amplifiers 514, 516 (e.g., solid state amplifiers or electron tube amplifiers). These amplified microwave inputs are supplied to Ports P and Q, separated spatially by an angle $\theta_q$. In the example system shown in FIG. 5, the two optional monitoring antennas 504, 506 are implemented together with the feedback controller 502. If a precision digital controller such as a high frequency FPGA (field programmable gate array) is implemented inside the microwave signal generator 508, the optional monitoring antennas 504, 506 and the feedback controller 502 can be removed from the microwave input system 500 as shown in a microwave input system 600 of FIG. 6.

The following discussion on mode rotation theory can be applied to any combination of $TE_{mnl}$ and $TM_{mnl}$ modes and, hybrid modes of $TE_{mnl}$ and $TM_{mnl}$ modes. For the sake of brevity, the subsequent illustrations will use examples with $TE_{mnl}$ and $TE_{m'n'l'}$ modes. Despite the differences in the formulations for fast and slow rotation methods, the conditions for purely clockwise and anti-clockwise rotations become identical between the fast and slow rotations. Hence the dynamical control of the radial uniformity in a microwave cavity chamber will be described based on the slow rotation, e.g. 1000-10,000 Hz rotational frequency, for the sake of brevity. However, the same arguments can be satisfied for the fast rotation as well.

Figure 6:
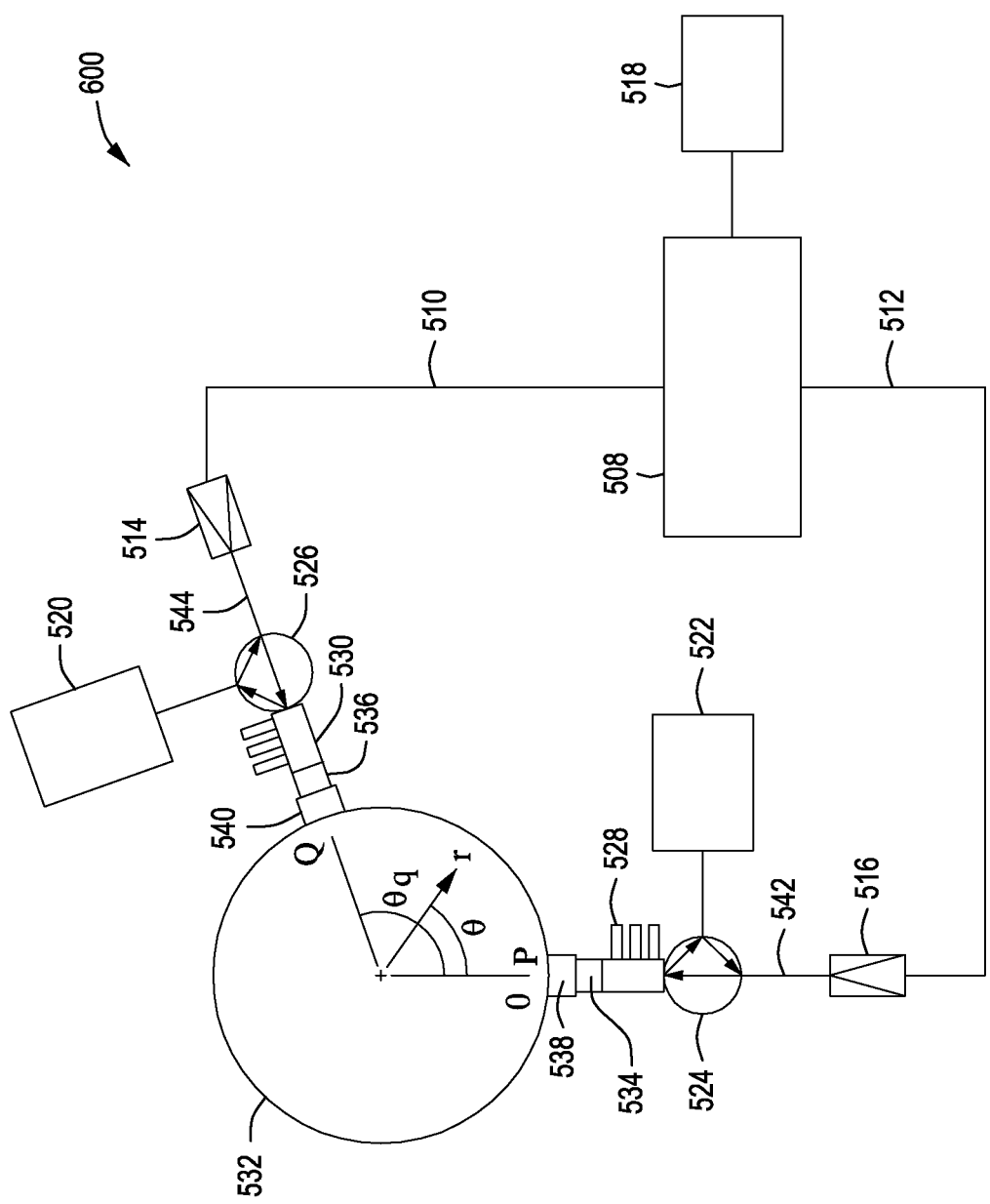
FIG. 6 is a schematic diagram illustrating components of a dual microwave input system for providing microwaves to a plasma chamber in accordance with some embodiments of the present principles.

The condition for excitation of a purely anti-clockwise rotation is represented as follows:

$$\varphi_{ant} = \frac{2r + 2s + 1}{2}\pi \quad \text{(Eq. 1)}$$

$$\theta_q = \frac{2r - (2s + 1)}{2m}\pi \quad \text{(Eq. 2)}$$

where $\varphi_{ant}$ is a temporal phase difference between Ports P and Q, and $\theta_q$ is a spatial angle between Ports P and Q as defined in FIG. 6. m is an azimuthal index integer of the $TE_{mnl}$. r and s are arbitrary integers for mathematical purposes. In order to simultaneously excite two modes defined as $TE_{mnl}$ and $TE_{m'n'l'}$ in the system configuration of FIG. 6, the two modes must have a common solution $\theta_q$. Explicitly:

$$\theta_q = \frac{2r - (2s + 1)}{2m}\pi \quad \text{(Eq. 3-1)}$$

$$\theta_{q'} = \frac{2r' - (2s' + 1)}{2m'}\pi$$

where:

$$\theta_q = \theta_{q'} \quad \text{(Eq. 3-2)}$$

As easily shown, a necessary condition for the common solution is that m and m' are both even or odd. Representatively, (m, r, s)=(1,1,0) and (m', r', s')=(3,2,0) satisfy a common solution of:

$$\theta_q = \theta_{q'} = \frac{\pi}{2} \quad \text{(Eq. 4)}$$

Since the temporal phase difference $\varphi_{ant}$ can be generated independently by the microwave signal generator 508 in FIG. 6, a common solution for $\varphi_{ant}$ is not required. Hence, substituting (m, r, s)=(1,1,0) and (m', r', s')=(3,2,0) into (Eq. 1)

$$\varphi_{ant} = \frac{3\pi}{2} = -\frac{\pi}{2} \text{ for } (m, r, s) = (1, 1, 0) \quad \text{(Eq. 5)}$$

$$\varphi'_{ant} = \frac{5\pi}{2} = -\frac{\pi}{2} \text{ for } (m', r', s') = (3, 2, 0) \quad \text{(Eq. 6)}$$

It is again noted that variables r, s, r', and s' are introduced for the sake of mathematics, and there is no physical corresponding quantities. Equations (4)-(6) mean that the $TE_{1nl}$ and $TE_{3n'l'}$ can be simultaneously excited with a common $$\varphi_{ant} = -\frac{\pi}{2}, \text{ and } \varphi'_{ant} = \frac{\pi}{2},$$

and temporal phase differences $$\theta_q = \frac{\pi}{2}$$

respectively.

Figure 9:
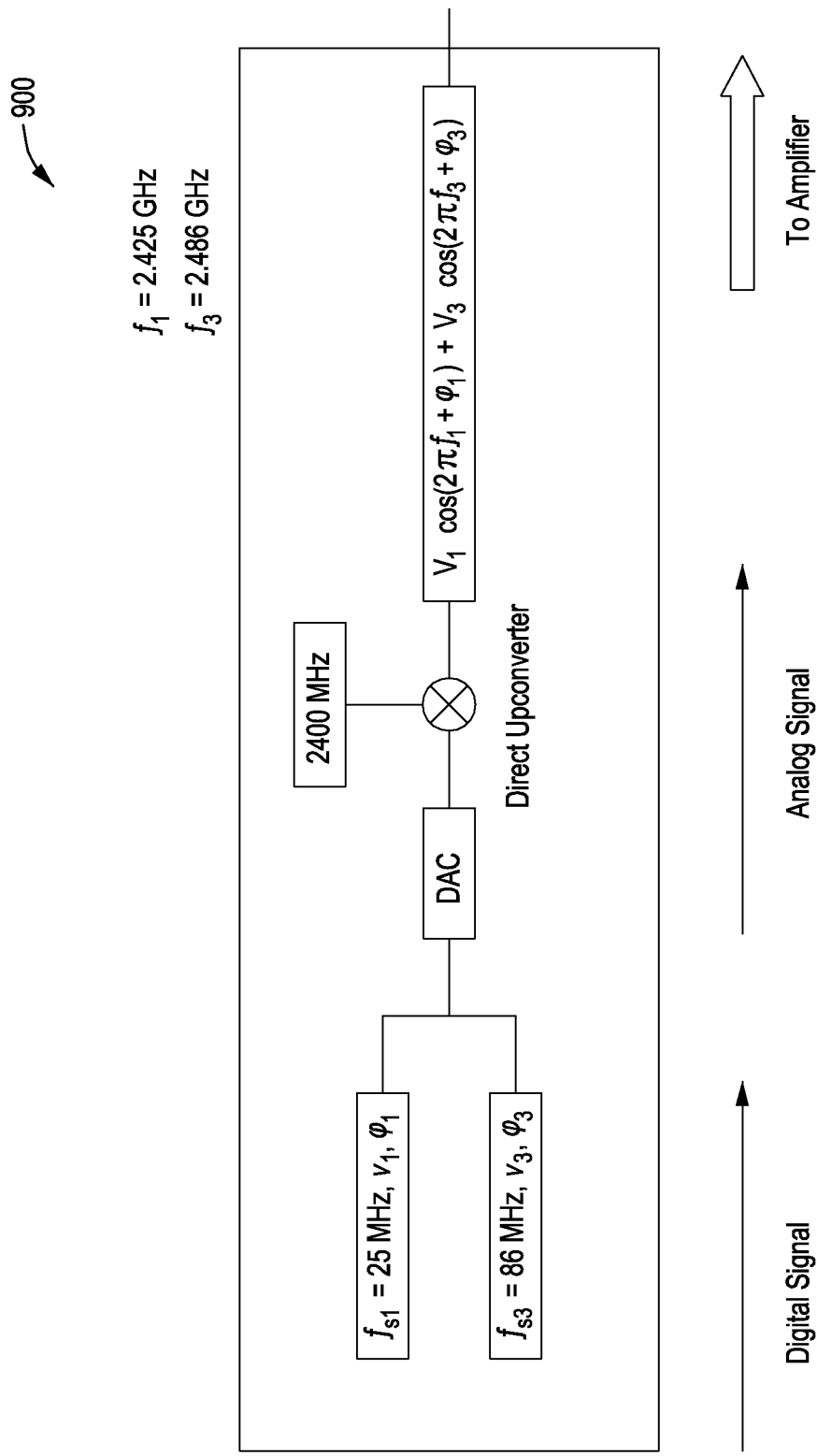
FIG. 9 is a diagram illustrating a first method of combining signal components of a microwave input for a system providing microwaves to a plasma chamber in accordance with some embodiments of the present principles.
Figure 10:
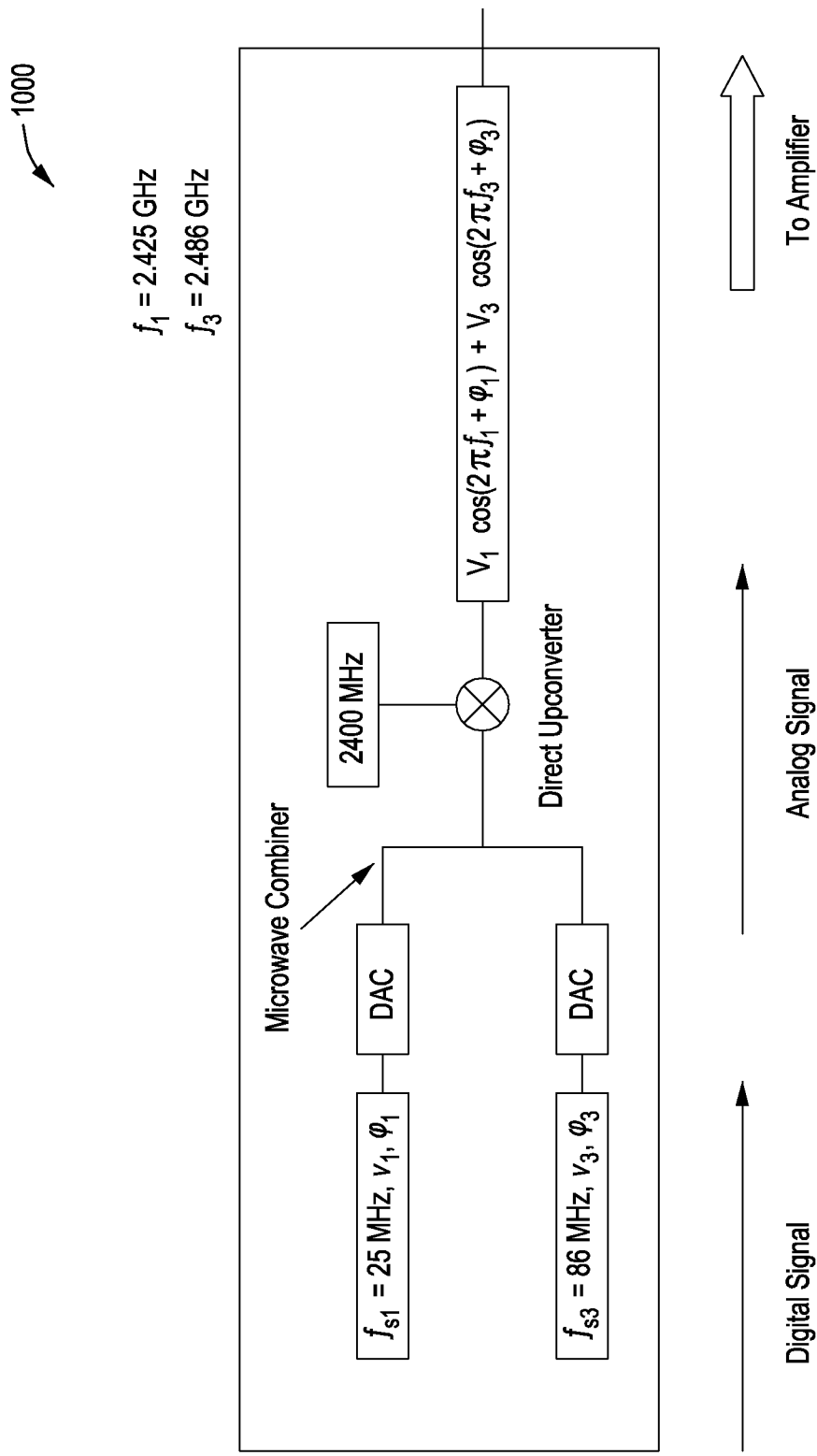
FIG. 10 is a diagram illustrating a second method of combining signal components of a microwave input for a system providing microwaves to a plasma chamber in accordance with some embodiments of the present principles.
Figure 11:
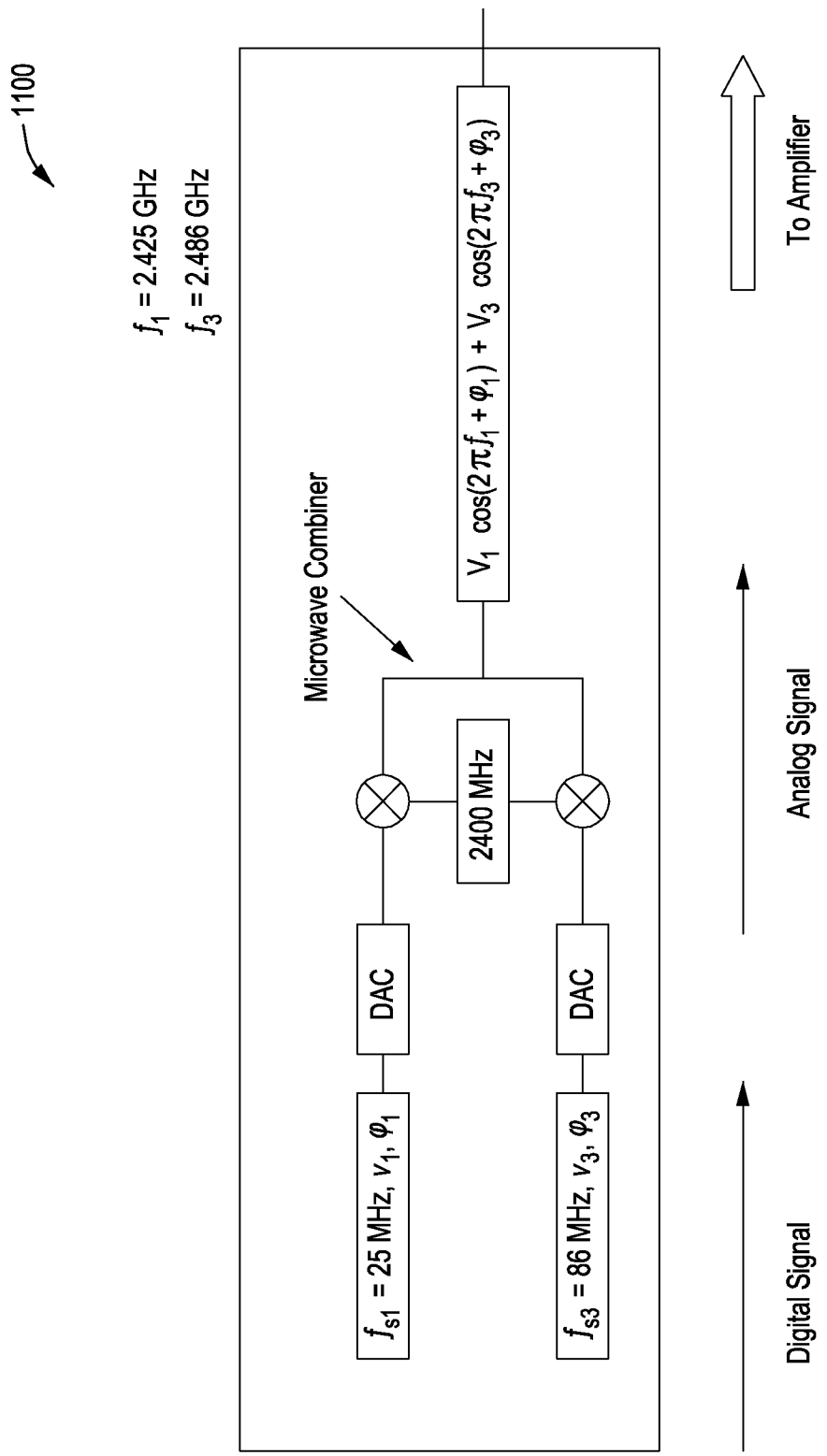
FIG. 11 is a diagram illustrating a third method of combining signal components of a microwave input for a system providing microwaves to a plasma chamber in accordance with some embodiments of the present principles.

For the sake of simplicity of calculation, the cavity geometry of FIG. 4 is considered, although the same argument is satisfied for the microwave cavities 200, 300 of FIGS. 2 and 3, respectively. When setting dimensions of a cylindrical cavity 702 and material parameters as shown in a microwave cavity 700 of FIG. 7, which is a simplified version of the microwave cavities 400A, 400B of FIG. 4A and FIG. 4B, the $TE_{111}$ and $TE_{311}$ can be excited at 2.425 GHz and 2.486 GHz, respectively. The microwave cavity 700 includes a dielectric plate 712 of, for example, $SiO_2$ with $\varepsilon=4.0$ and a height d22 of 31.084 mm. A plasma chamber 710 with plasma 728 has a height d3, for example, of 60 mm and a diameter, for example, of 330 mm. When using two sets of wide bandwidth amplifiers 814, 816 and tuners 828, 830 of 2.450±0.050 GHz with a microwave cavity 832, the two modes can be excited and rotated by adopting a microwave input system 800 of FIG. 8, which is derived from the microwave input system 600 of FIG. 6. In FIG. 8, Ports P and Q are spatially separated by $$\theta_q = \frac{\pi}{2}$$

based on Eq. (4). Configurations of the temporal phases $\varphi_{XY}$ at the two frequencies inside the microwave signal generator 808 are given by Equations (5) and (6), where the first subscripts of A and B in $\varphi_{XY}$ denote "Unit-A 802 and Unit-B 804" or (Set-A 806 and Set-B 810), respectively, and the second ones 1 and 3 denote "m=1 and 3" (or $TE_{111}$ and $TE_{311}$), respectively. To make the circular rotations, the amplitudes of Set-A 806 and Set-B 810 are taken equal for each mode of the $TE_{111}$ and $TE_{311}$, denoting respectively $V_1$ and $V_3$ (N.B. generally $V_1 \neq V_3$). The frequencies, voltage amplitudes, and temporal phases inside the microwave signal generator 808 can be given by an FPGA as illustrated below. FIG. 9 is a diagram illustrating a first method 900 of combining signal components of a microwave input for a system providing microwaves to a plasma chamber in accordance with some embodiments. The first method 900 of FIG. 9 is one example of the processing that occurs for Unit-A 802 or for Unit-B 804 inside the microwave signal generator 808. Two digital seed signals of (frequency $f_{s1}$=25 MHz, voltage amplitude $v_1$, temporal phase $\varphi_1$) and (frequency $f_{s3}$=86 MHz, voltage amplitude $v_3$, temporal phase $\varphi_3$)) are generated by an FPGA along with RAM/ROM (random access memory/read only memory). After combining the two digital signals, the two signals are passed to a DAC (Digital to Analog Converter) to make an analog signal represented by $V_1 \cos(2\pi f_1+\varphi_1)+V_3 \cos(2\pi f_3+\varphi_3)$, which is sent to a wide bandwidth amplifier. Other embodiments of Unit-A or Unit-B are shown in a second method 1000 of FIG. 10 and a third method 1100 of FIG. 11 in which a microwave combiner such as Wilkinson Type is introduced. Going from the first method 900 to the third method 1100, the cost increases because more components are used. For testing purposes, the third method 1100 of FIG. 11 is advantageous because two simple sinusoidal analog microwave signals can be diagnosed prior to the signals going into a microwave-combiner by using a spectrum analyzer or an oscilloscope with a downconverter.

Figure 7:
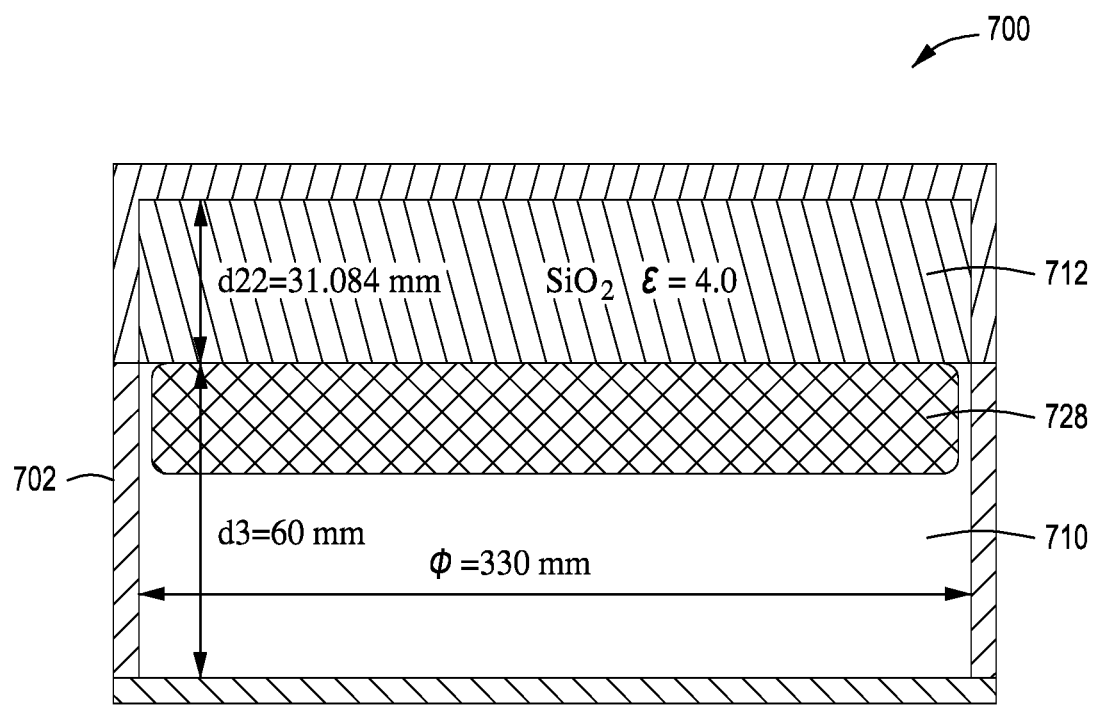
FIG. 7 is a schematic cross-sectional drawing illustrating a portion of a plasma processing system with dual cavities in accordance with some embodiments of the present principles.
Figure 8:
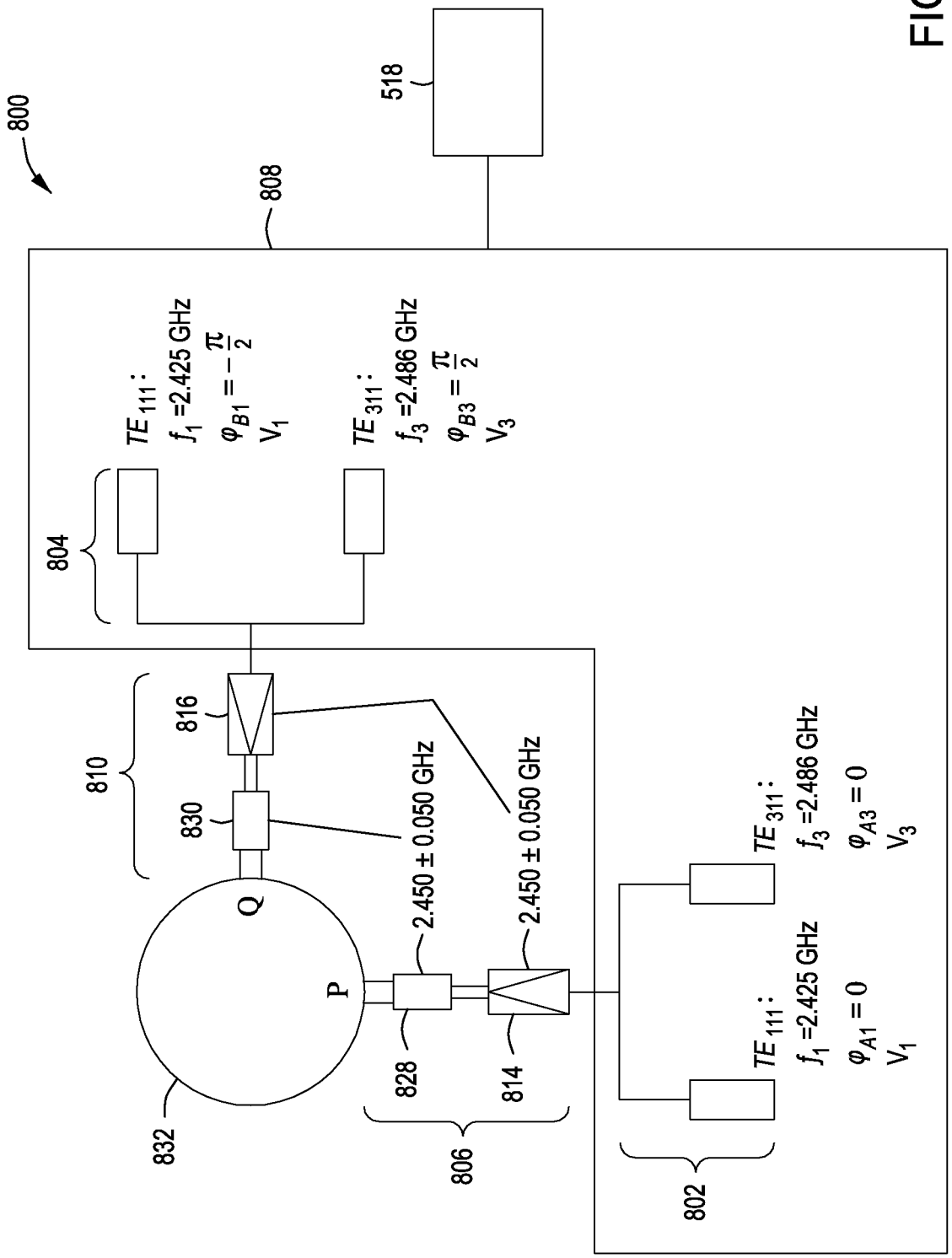
FIG. 8 is a schematic diagram illustrating components of a dual microwave input system with 90 degrees of separation for providing microwaves to a plasma chamber in accordance with some embodiments of the present principles.

The microwave cavity 700 of FIG. 7 combined with the microwave input system 800 of FIG. 8 can excite the $TE_{111}$ and $TE_{311}$ simultaneously. For the sake of simplicity, assume $V_1=V_3$, and also assume that the gains of the full bandwidth of the amplifiers are constant across the entire bandwidth. The absolute values of electric fields |E| of the two modes are plotted as functions of radius of a cavity in a graph 1200 of FIG. 12. Note that:

$$|E|=\sqrt{E_r^2+E_\theta^2} \quad \text{(Eq. 7)}$$

where $E_r$ and $E_\theta$ are respectively the radial and azimuthal components of an electric filed E of each mode. The $TE_{111}$ and $TE_{311}$ modes have center-high and edge-high field distributions, respectively. Furthermore, the former and latter have azimuthal angle $\theta$ dependences of $\cos\theta$ and $\cos 3\theta$, respectively. If the slow rotation is adapted to these modes, the $TE_{111}$ and $TE_{311}$ will generate azimuthally symmetrical field distributions of center-high and edge-high, respectively as time averaged values. Since the two frequencies of the $TE_{111}$ and $TE_{311}$ are independent inside the cavity, the two modes of the slow rotation can be excited by the signal setup 1300A tabulated in FIG. 13A. For a reference, the corresponding signal setup 1300B of the fast rotation is tabulated in FIG. 13B. As already mentioned, in general, $V_1 \neq V_3$ and $\Omega_1 \neq \Omega_3$. A slow rotational frequency is given by $$\frac{\Omega_i}{2\pi} = 1 - 10000 \text{ Hz } (i=1, 3)$$

in FIG. 13A, whereas a fast rotational frequency is determined by a corresponding carrier frequency $f_i$ in FIG. 13A. In FIG. 13A and FIG. 13B, the $TE_{111}$ and $TE_{311}$ are set at anti-clockwise rotations. However, any kind of combinations of clock or anti-clockwise rotations can be set by assigning proper temporal phases $\varphi$'s.

In some embodiments, the benefits of using mixed mode plasma activation may be achieved using a single input port to inject microwave signals into the cavity. A first frequency of a first mode may be pulsed into the single port and then a second frequency of a second mode may be pulsed into the single port in an alternate fashion.

Figure 14:
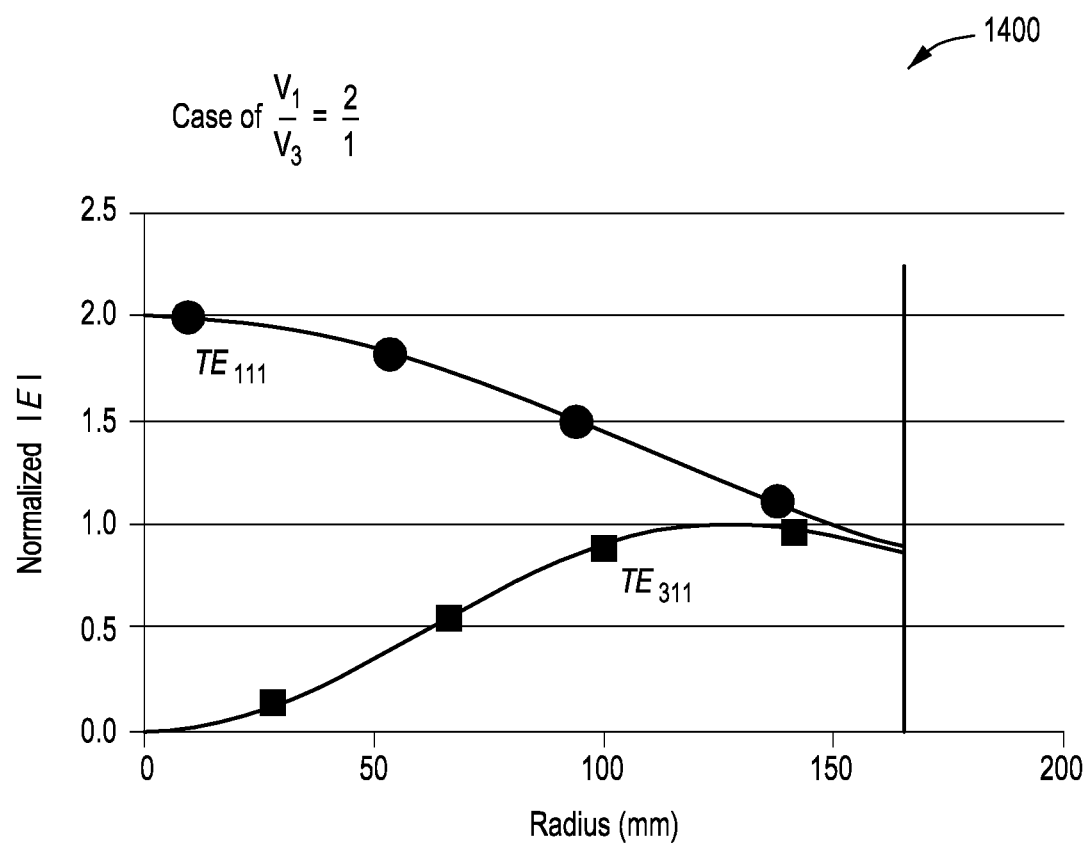
FIG. 14 is a graph illustrating effects on plasma in a microwave cavity using a 2:1 power ratio between center-high and edge-high components of microwave inputs in accordance with some embodiments of the present principles.
Figure 15:
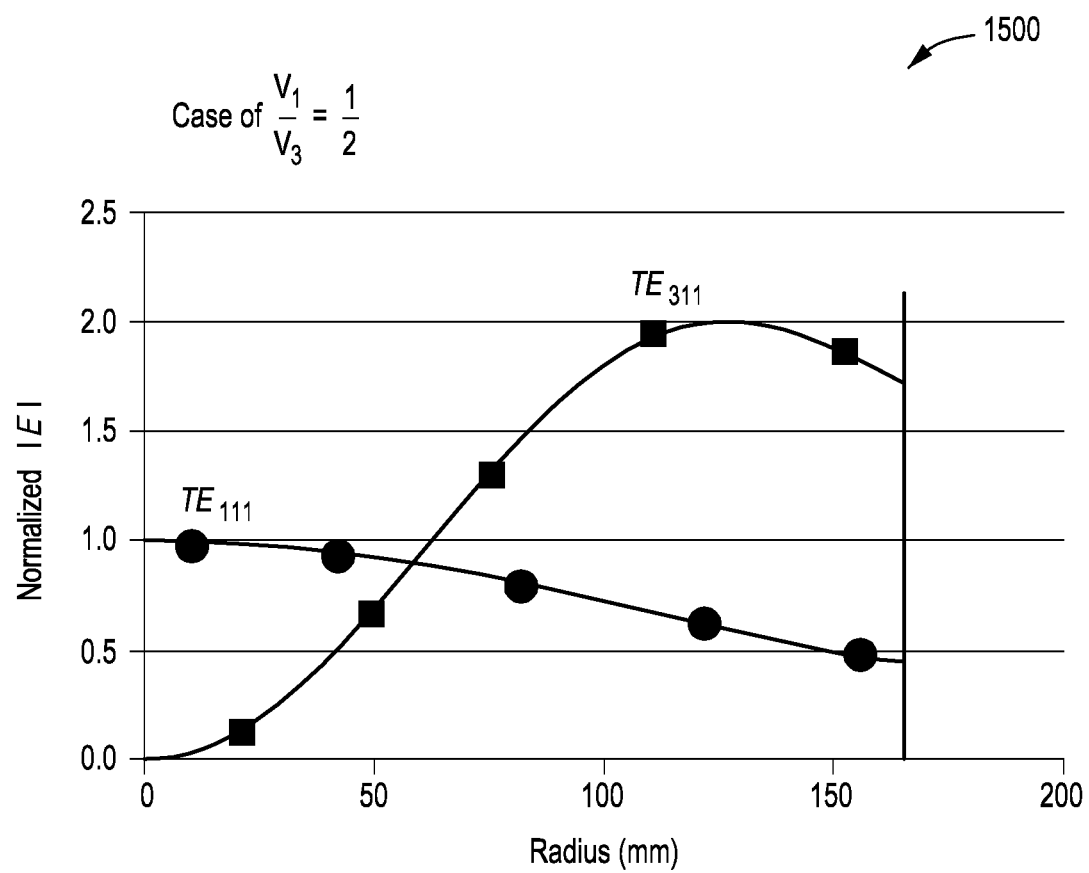
FIG. 15 is a graph illustrating effects on plasma in a microwave cavity using a 1:2 power ratio between center-high and edge-high components of microwave inputs in accordance with some embodiments of the present principles.

Changing a ratio of $V_1$ to $V_3$ yields a resultant field profile and generates a plasma distribution for an operator of the semiconductor chamber. A graph 1400 of FIG. 14 and a graph 1500 of FIG. 15 show examples of when the voltage ratio of $V_1/V_3$ are chosen at 2 and 0.5, respectively, generating a center-high and edge-high field distributions, respectively.

Figure 16:
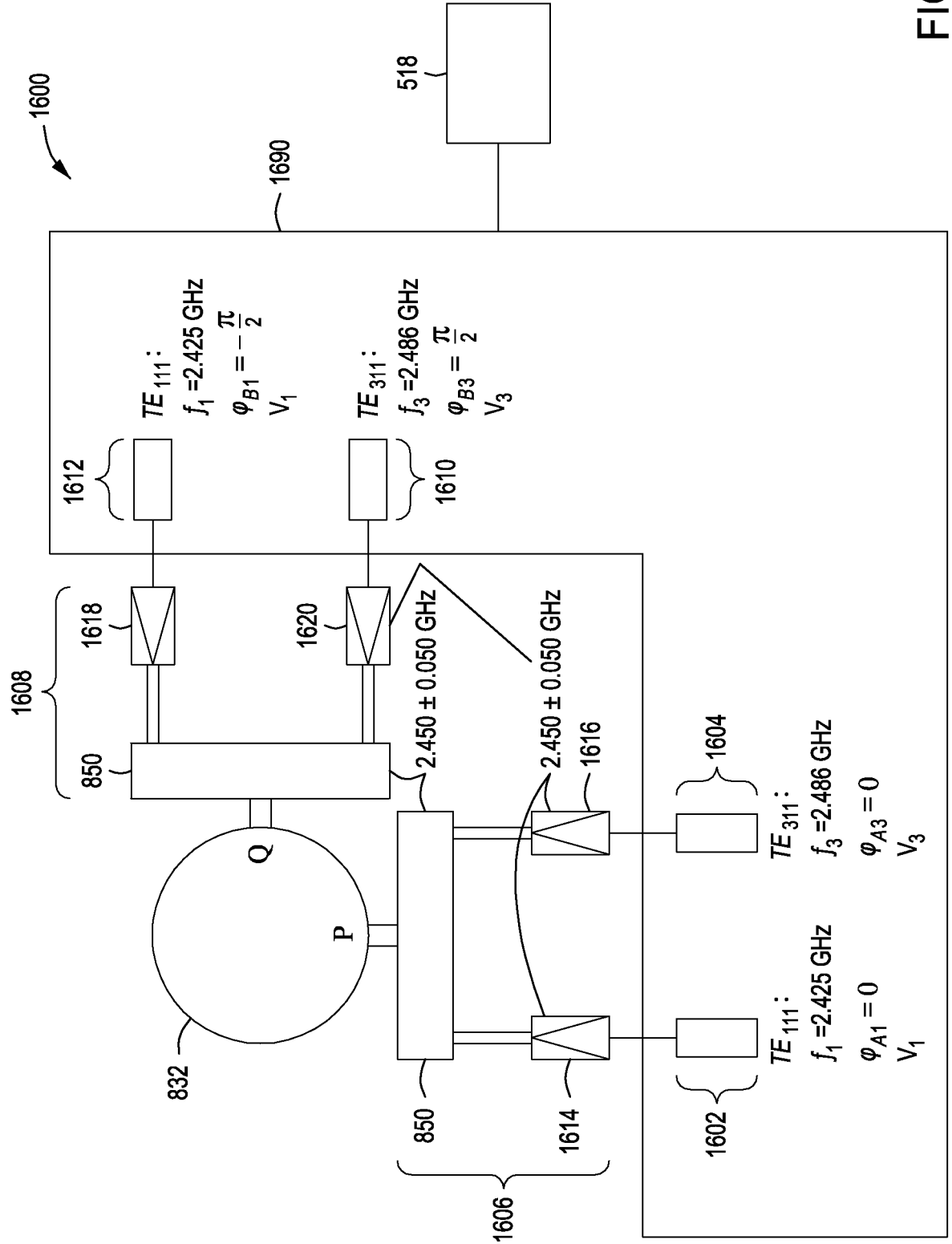
FIG. 16 is a schematic diagram illustrating dual amplifiers for inputs of a dual microwave input system for providing microwaves to a plasma chamber in accordance with some embodiments of the present principles.
Figure 17:
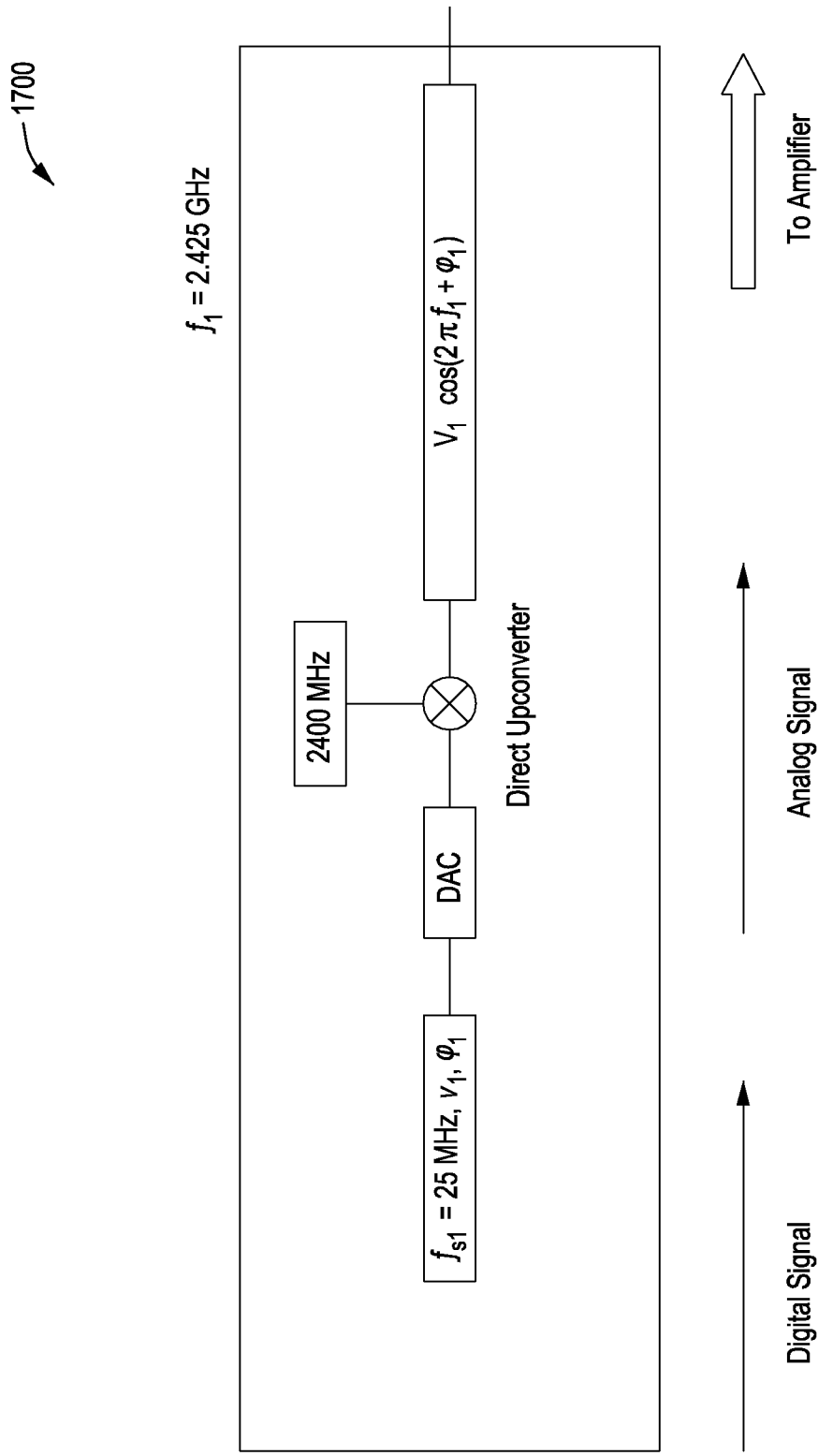
FIG. 17 is a diagram illustrating a method of generating a $TE_{111}$ signal component for the system of FIG. 16 in accordance with some embodiments of the present principles.
Figure 18:
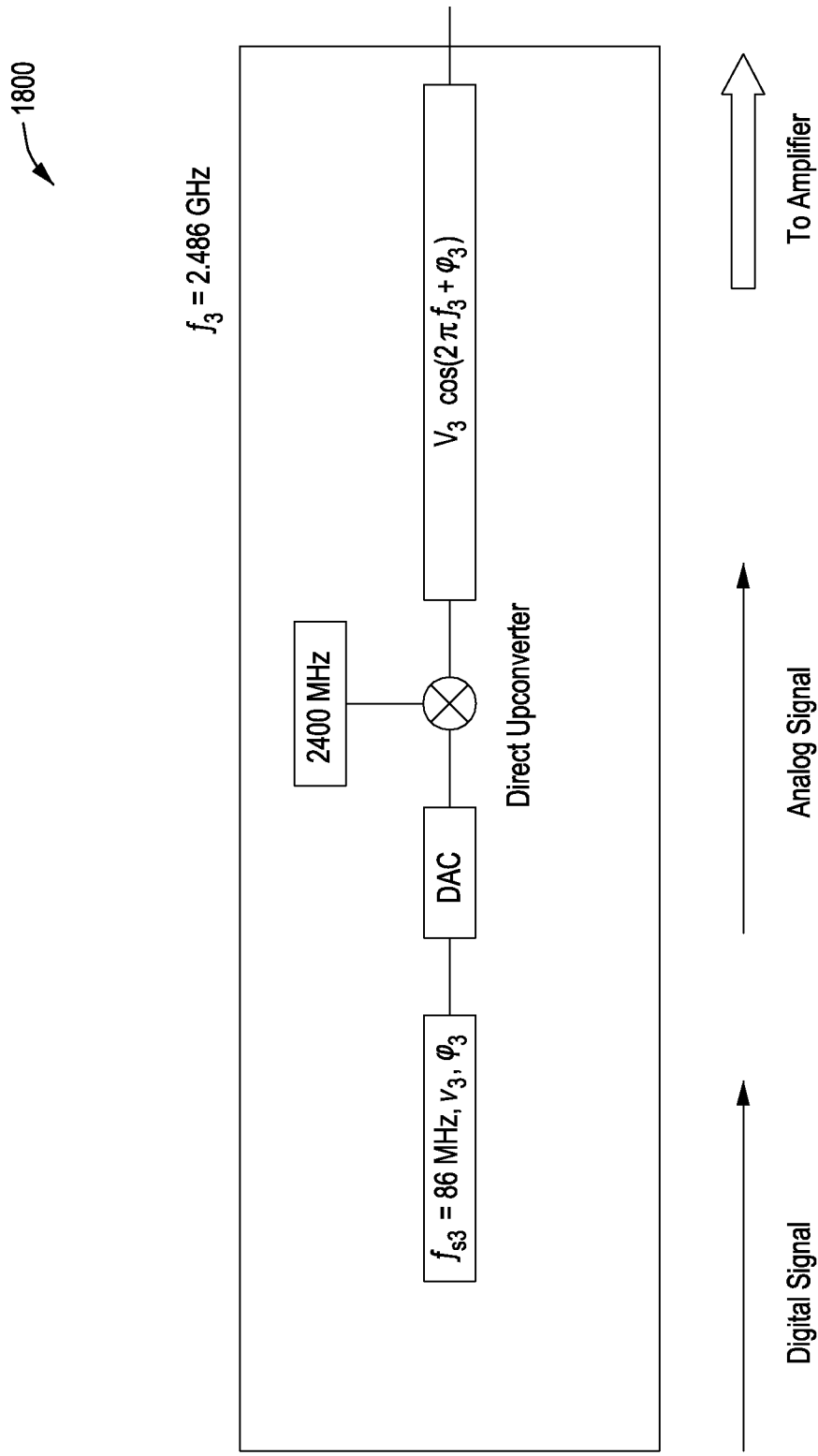
FIG. 18 is a diagram illustrating a method of generating a $TE_{311}$ signal component for the system of FIG. 16 in accordance with some embodiments of the present principles.

In the case when the linearity of the amplifiers in FIG. 8 is not adequate, or the amplifiers have input power limitations, or the tuner 828 cannot treat the two frequencies, which quite often happens in a contemporary digital controlled tuner, a configuration of a microwave input system 1600 of FIG. 16 can be adopted with a microwave signal generator 1690 in which Unit-A 802 and Unit-B 804 are split into Unit-A 1602 and Unit-A' 1604, Unit-B 1610, and Unit-B' 1612, respectively, at each frequency of the $TE_{111}$ and $TE_{311}$. As a result, the first method 900 of FIG. 9 is simplified to a method 1700 of FIG. 17 and a method 1800 of FIG. 18 for the $TE_{111}$ and $TE_{311}$, respectively. In Set-A 1606 and Set-B 1608, each frequency is amplified by an amplifier 1614, 1616, 1618, 1620, followed by merging the powers of the two frequencies via a dual frequency tuner 850. Basically, the signal setups 1300A, 1300B in FIG. 13A and FIG. 13B do not change.

The microwave input system 800 of FIG. 8 is designed on the basis that the $TE_{111}$ and $TE_{311}$ have a common solution of $\theta_q$. Since these two modes are independent, a microwave input system 1900 of FIG. 19A can also provide the same dynamical control of the radial uniformity as the microwave input system 800 of FIG. 8 does. In this configuration, an angle $\theta_k$ between Ports P and P' can be set an arbitrary angle $(0-2\pi)$, as long as the angle $\theta_q$ between Ports P and Q, and the angle $\theta_{q'}$ between Ports P' and Q' are set at as calculated in Equations (3-1), (3-2) and (4). Set-A 1918 and Set-B 1904 excite the $TE_{111}$, whereas Set-A' 1920 and set-B' 1902 excite the $TE_{311}$. Like FIG. 16, the first method 900 of FIG. 9 is simplified to the method 1700 of FIG. 17 and the method 1800 of FIG. 18 for the $TE_{111}$ and $TE_{311}$, respectively. Basically, the signal setups 1300A, 1300B in FIG. 13A and FIG. 13B, respectively, do not change. The microwave input system 1900A of FIG. 19A includes a microwave signal generator 1990 with Unit-A 1914, Unit-A' 1916, Unit-B 1922, and Unit-B' 1924. An input portion includes Set-A 1918, Set-A' 1920, Set-B 1904, and Set-B' 1902. The microwave input system 1900 includes the microwave input system 800 of FIG. 8 as a subset. The microwave input system 1900A includes twice the number of amplifiers 1906-1912 and tuners 1940-1946, increasing the cost of the system significantly. However, operational reliability is high.

Figure 19A:
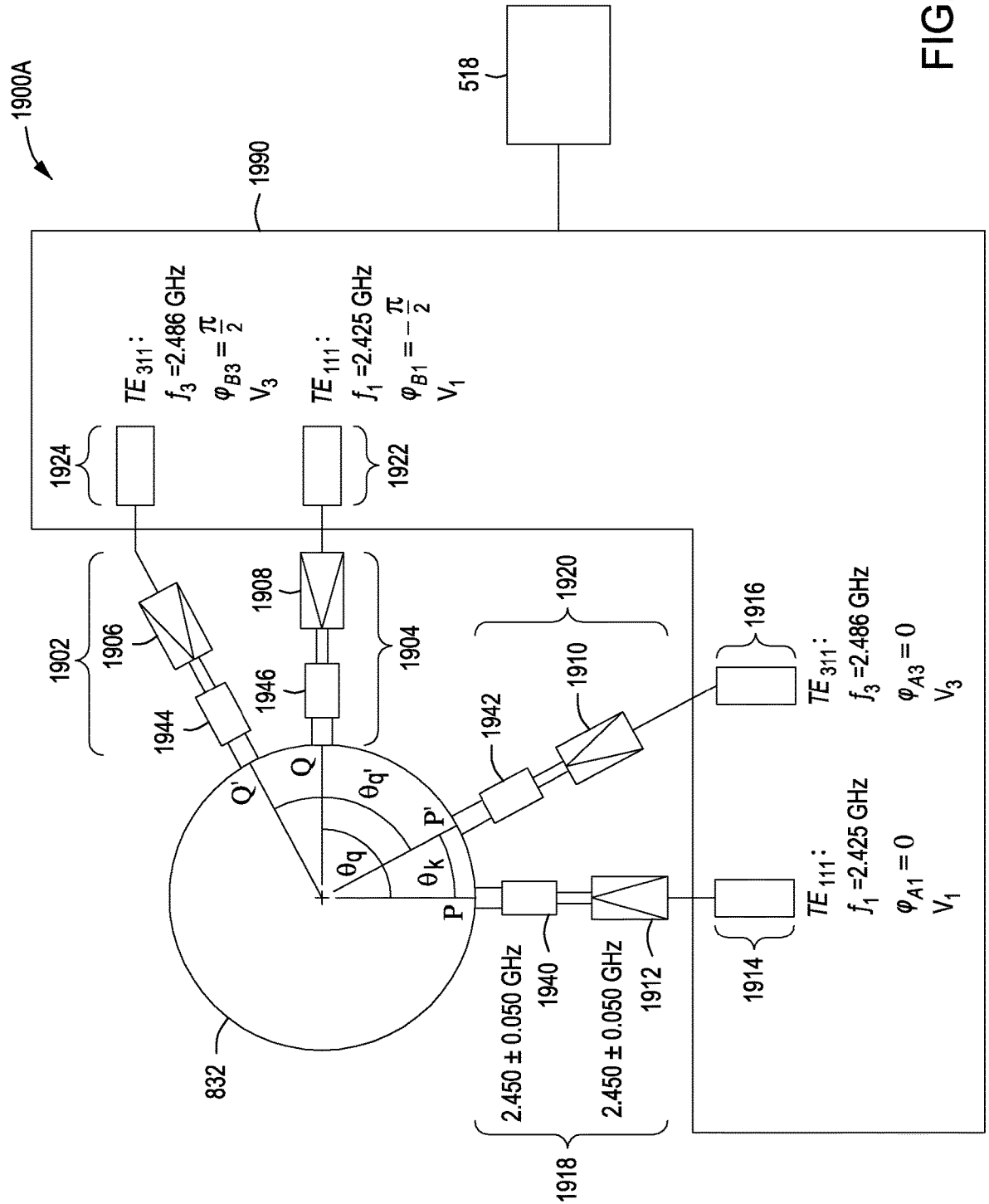
FIG. 19A is a schematic diagram illustrating dual amplifiers and dual tuners for inputs of a dual microwave input system for providing microwaves to a plasma chamber in accordance with some embodiments of the present principles.
Figure 19B:
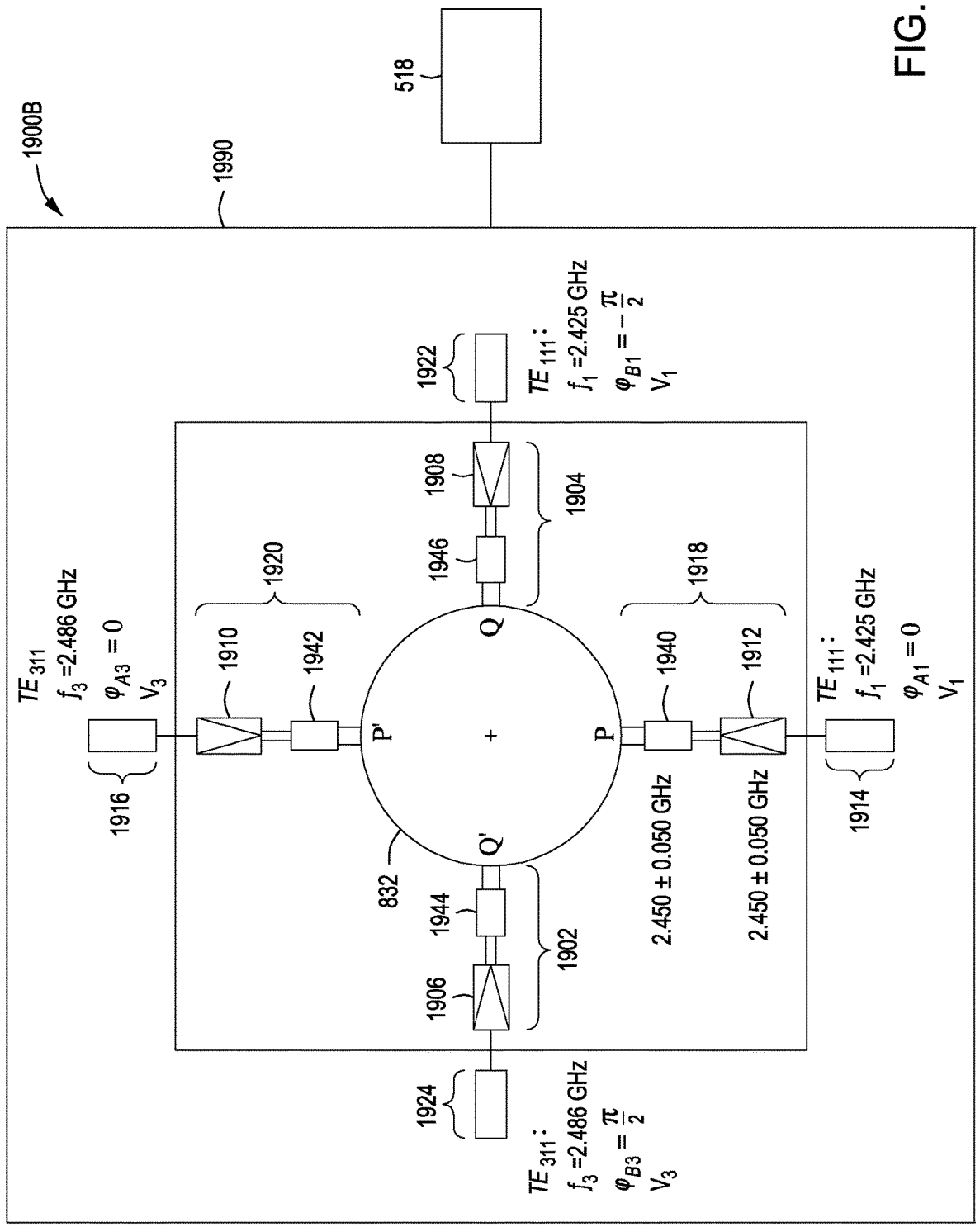
FIG. 19B is a schematic diagram illustrating a variation of the dual amplifiers and dual tuners for inputs of the dual microwave input system of FIG. 19A in accordance with some embodiments of the present principles.

FIG. 19B illustrates a special case of FIG. 19A. The microwave input system 1900B is favorable with respect to mechanical integration. Furthermore, since input ports P, Q, P', Q' are equally separated, heating of the dielectric plate 712 (FIG. 7) is more uniform with four input microwaves that are well dispersed.

Next, consider a case when the $TE_{mnl}$ and $TE_{m'n'l'}$ have no common solution by taking the $TE_{111}$ and $TE_{211}$ as an example (note that m=1 and m'=2 are not both even or odd).

Substituting (m, r, s)=(1,1,0) and (2,1,0), obtains:

$$\theta_q = \frac{\pi}{2} \quad \text{(Eq. 8)}$$

$$\varphi_{ant} = \frac{3\pi}{2} = -\frac{\pi}{2} \text{ for } TE_{111} \text{ and} \quad \text{(Eq. 9)}$$

$$\theta_q' = \frac{3\pi}{4} \quad \text{(Eq. 10)}$$

$$\varphi_{ant}' = \frac{3\pi}{2} = -\frac{\pi}{2} \text{ for } TE_{211} \quad \text{(Eq. 11)}$$

Figure 12:
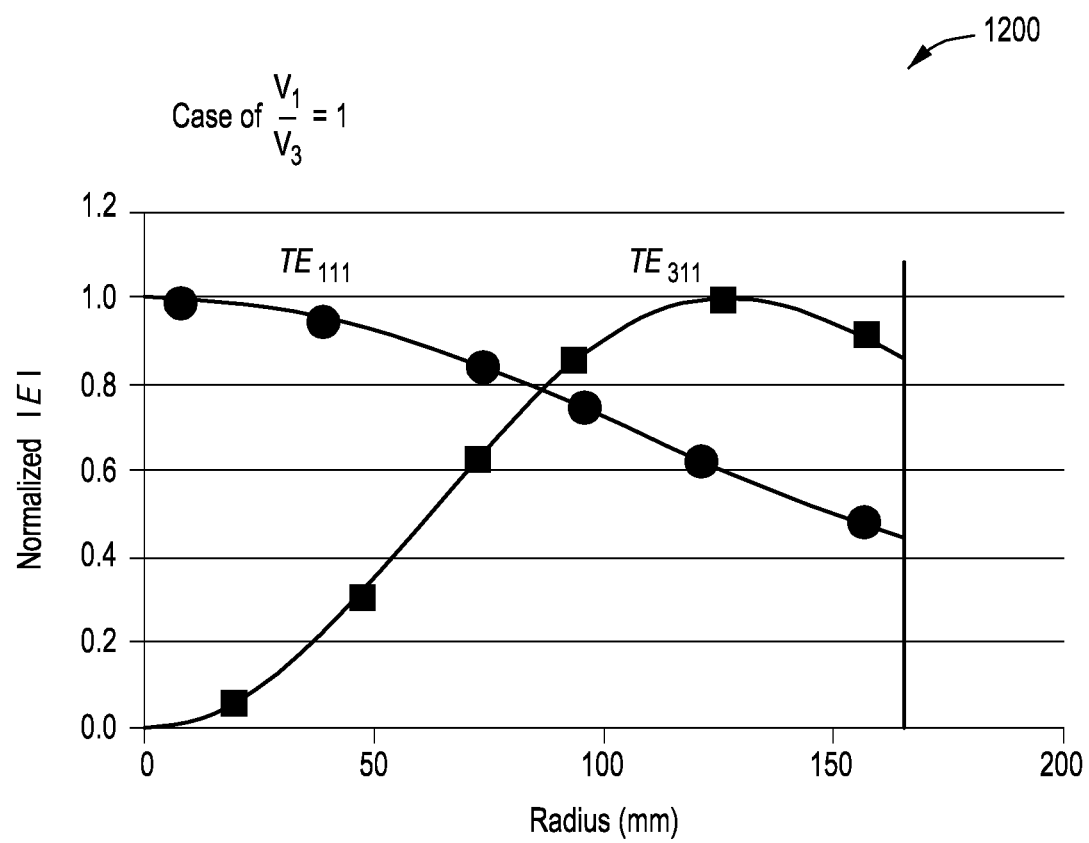
FIG. 12 is a graph illustrating effects on plasma in a microwave cavity using a 1:1 power ratio between center-high and edge-high components of microwave inputs in accordance with some embodiments of the present principles.
Figure 20:
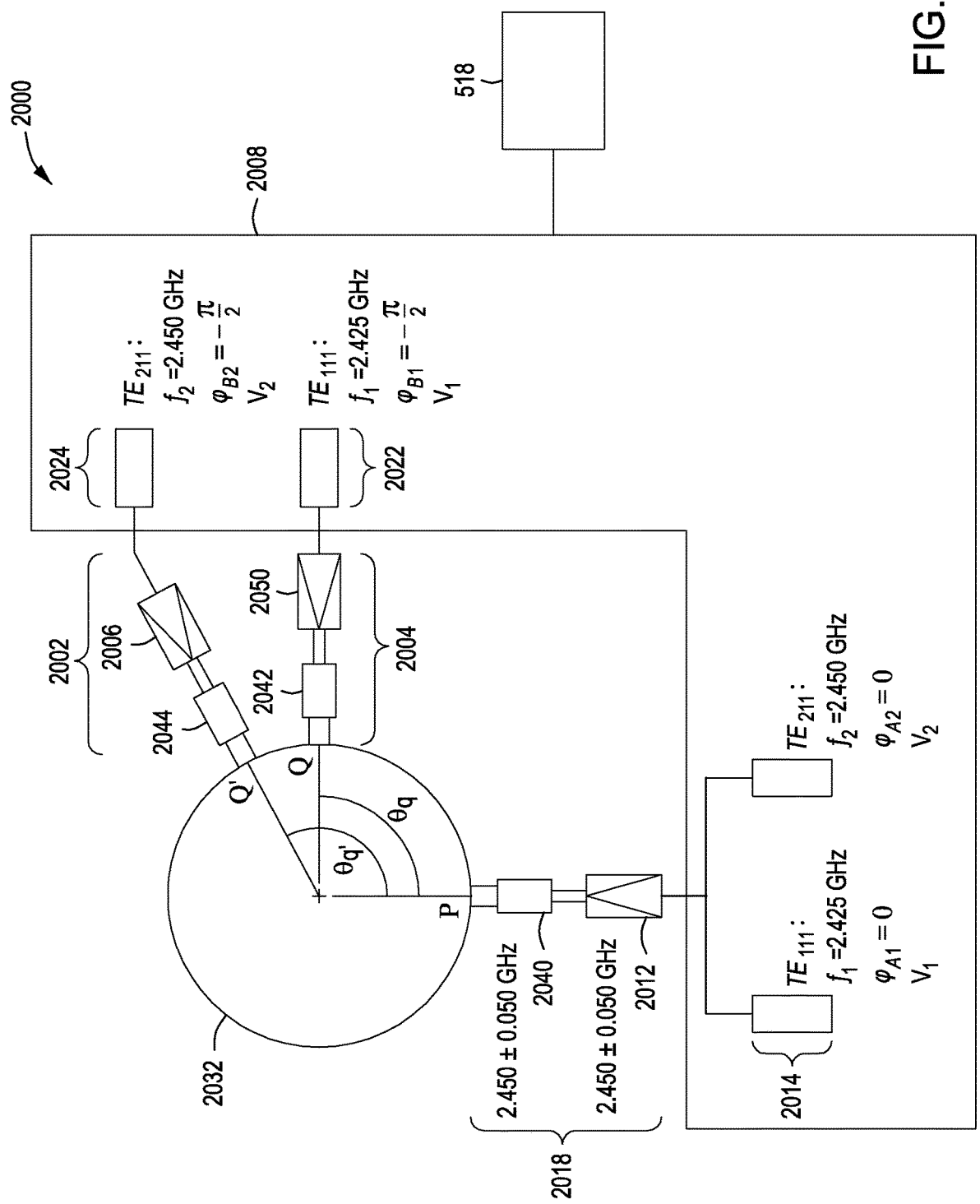
FIG. 20 is a schematic diagram illustrating a triple microwave input system for providing microwaves to a plasma chamber in accordance with some embodiments of the present principles.
Figure 21:
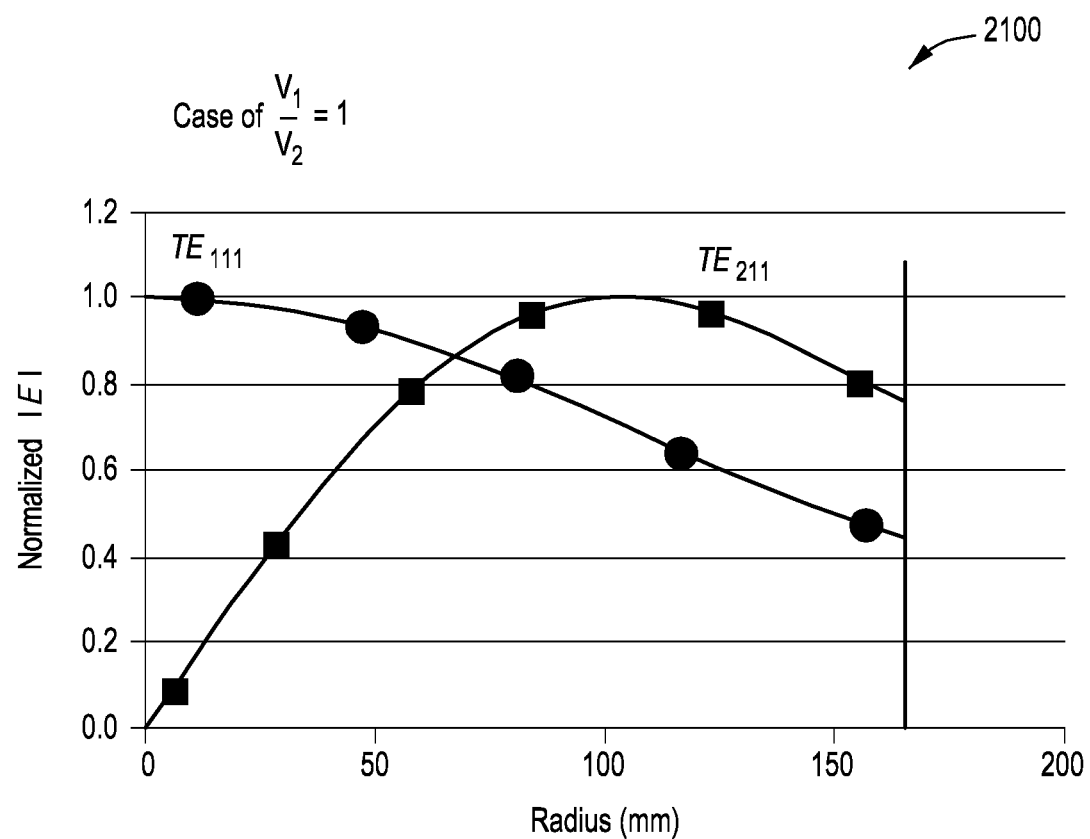
FIG. 21 is a graph illustrating effects on plasma in a microwave cavity using a 1:1 power ratio between center-high and edge-high components of microwave inputs of the system of FIG. 20 in accordance with some embodiments of the present principles.

The combination of the microwave cavity 700 of FIG. 7 with a microwave input system 2000 of FIG. 20 can achieve the dynamical control of the radial uniformity. In FIG. 20, the microwave input system 2000 includes a Unit-A 2014 with a similar form of FIGS. 9-11, whereas Unit-B 2022 and Unit-B' 2024 have similar forms to that of FIG. 17 or FIG. 18. The microwave input system 2000 also includes a microwave cavity 2032, microwave signal generator 2008, a Set-A 2018 with an amplifier 2012 and a tuner 2040, a Set-B 2004 with an amplifier 2050 and a tuner 2042, and a Set-B' 2002 with an amplifier 2006 and a tuner 2044. The absolute values of electric fields |E| of the two modes are plotted as functions of radius of the cavity in the case of $$\frac{V_1}{V_2} = 1$$

in a graph 2100 of FIG. 21, corresponding to the graph 1200 of FIG. 12. The signal setups 1300A, 1300B corresponding to FIGS. 13A and 13B are represented in signal setups 2300A, 2300B of FIG. 23A and FIG. 23B, respectively.

Figure 22:
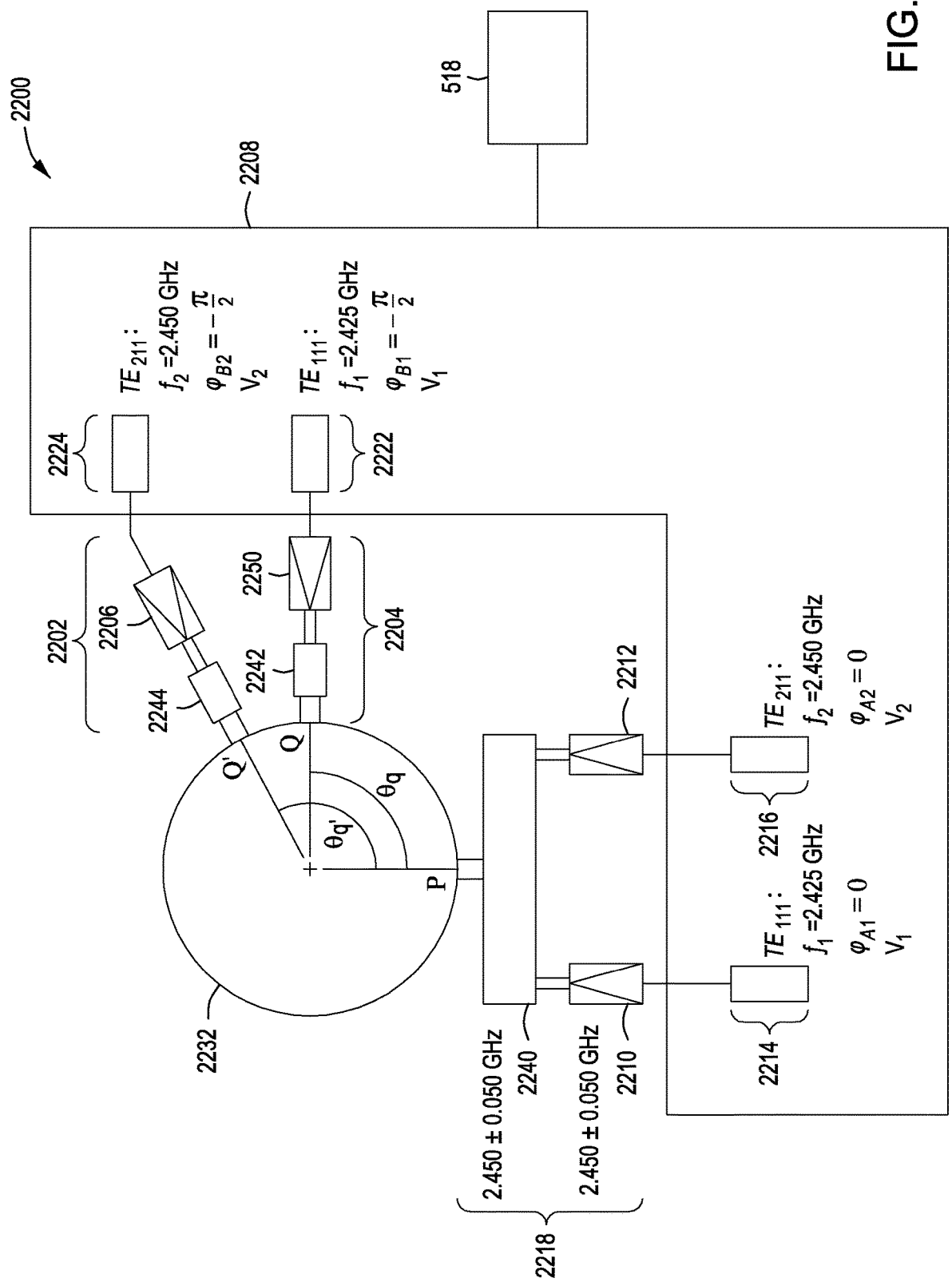
FIG. 22 is a schematic diagram illustrating a triple microwave input system with at least one set of dual amplifiers for one input for providing microwaves to a plasma chamber in accordance with some embodiments of the present principles.

A microwave input system 2200 of FIG. 22 is an alternative form of the microwave input system 2000 of FIG. 20 that can be used when the linearity of amplifiers 2206-2212 are not adequate, or the tuner 828 cannot treat the two frequencies. The units (Unit-A 2214, Unit-A' 2216, Unit-B 2222, Unit-B' 2224) will have similar forms to that of FIG. 17 or 18. The microwave input system 2200 uses a dual frequency tuner 2240 for Set-A 2218. The microwave input system 2200 includes a microwave cavity 2232 including the Set-A 2218 with two amplifiers 2210, 2212 and the dual frequency tuner 2240, Set-B 2204 with an amplifier 2250 and a tuner 2242, Set-B' 2202 with an amplifier 2206 and a tuner 2244, and a microwave signal generator 2208 with Unit-A 2214, Unit-A' 2216, Unit-B 2222, and Unit-B' 2224.

Figure 24:
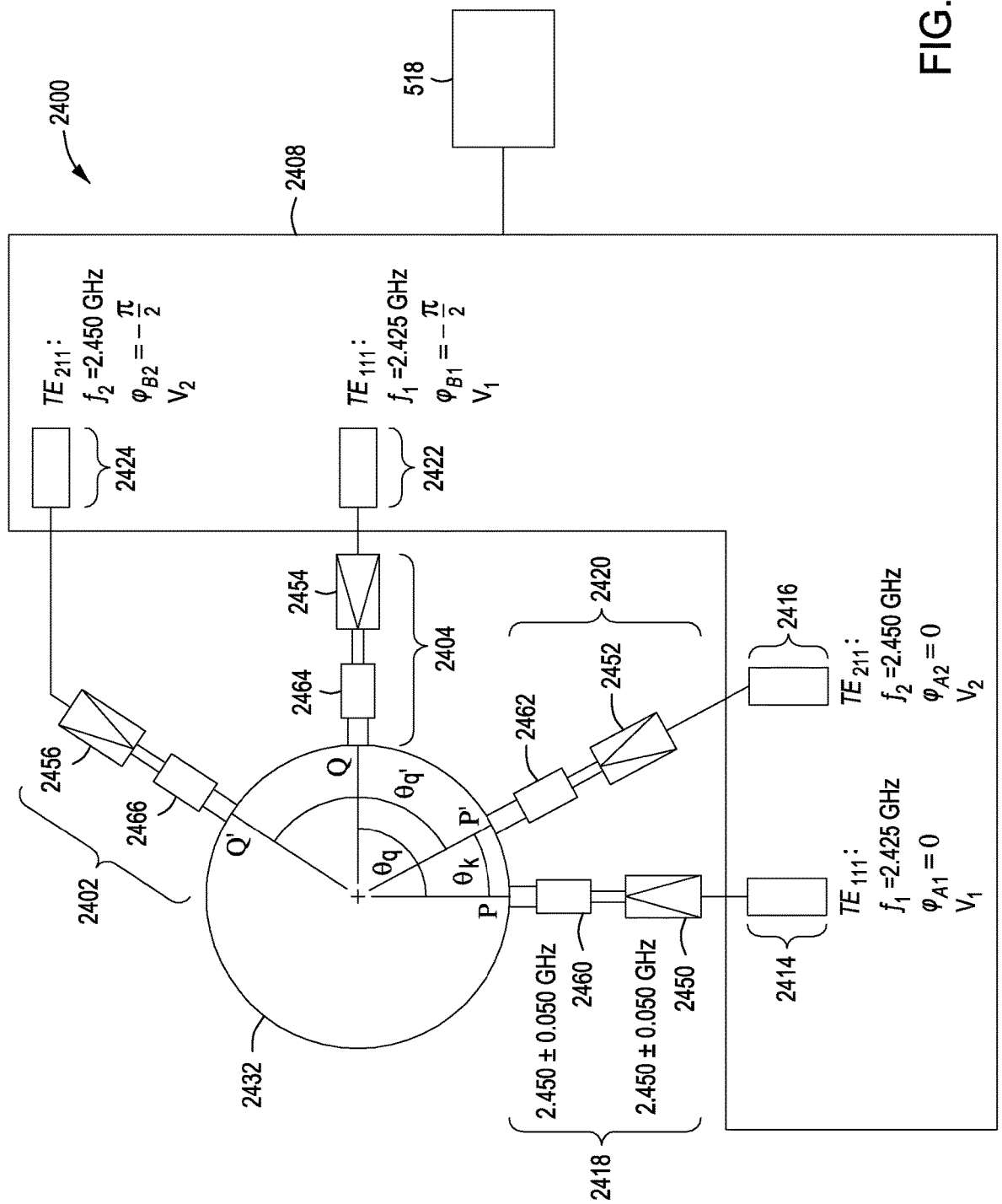
FIG. 24 is a schematic diagram illustrating a quad microwave input system for providing microwaves to a plasma chamber in accordance with some embodiments of the present principles.

The other alternative form corresponding to the microwave input system 1900 of FIG. 19 is represented in a microwave input system 2400 of FIG. 24. The microwave input system 2400 includes a microwave cavity 2432, a Set-A 2418 with an amplifier 2450 and a tuner 2460, a Set-A' 2420 with an amplifier 2452 and a tuner 2462, a Set-B 2404 with an amplifier 2454 and a tuner 2464, and a Set-B' 2402 with an amplifier 2456 and a tuner 2466. The microwave input system 2400 also includes a microwave signal generator 2408 with a Unit-A 2414, a Unit-A' 2416, a Unit-B 2422, and a Unit-B' 2424.

The microwave input system configurations of FIG. 20 (and also FIG. 22) and FIG. 24 (and also FIG. 19) are the general setup to excite and rotate two modes inside a cylindrical microwave cavity. The microwave input system configuration can be easily expanded to excite and rotate three or more modes by adding Ports Q" in the microwave input system 2000 of FIG. 20, or Ports P" and Q" in the microwave input system 2400 of FIG. 24, etc.

Figure 25:
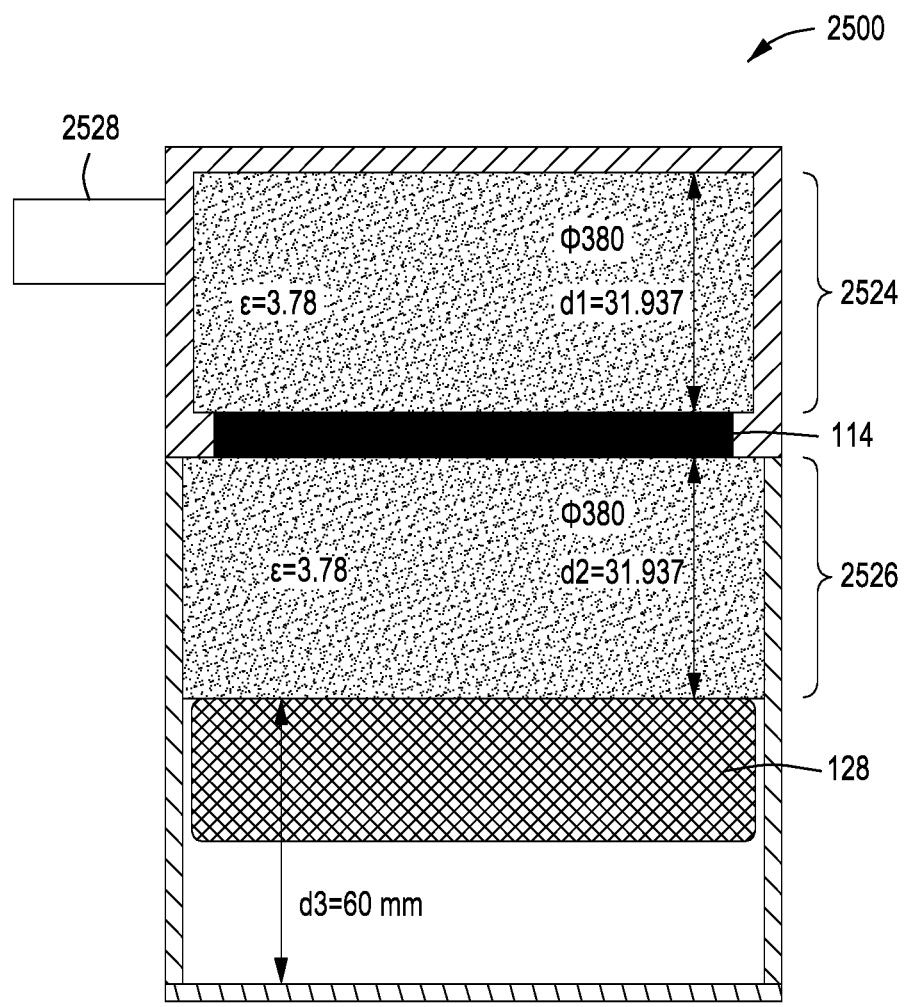
FIG. 25 is a schematic cross-sectional drawing illustrating a portion of a plasma processing system with a metallic bottom plate with radiation slots within a waveguide cavity that supports $TE_{111}$, $TE_{211}$, and $TE_{311}$ eigenmodes in accordance with some embodiments of the present principles.

Some embodiments can be based on the microwave cavity 100 of FIG. 1. Since the top cavity 124 and the bottom cavity 126 in FIG. 1 are weakly coupled through a metallic bottom plate with radiation slots 114, the embodiments are slightly complicated. A microwave cavity 2500 of FIG. 25 is a simplified instance, where two cavities 2524, 2526 have the identical properties, e.g. ϕ380 mm, dielectric constant ε=3.78, d1=d2=31.937 mm. For the sake of brevity, frequency shifts caused by the weak coupling between the two cavities are neglected. In this configuration, $TE_{111}$, $TE_{211}$ and $TE_{311}$ are excited at 2.425, 2.445 and 2.474 GHz, respectively in both cavities 2524, 2526. Hence, when exciting $TE_{111}$ and $TE_{311}$, the microwave input system configurations of FIGS. 8, 16, and 19 can be used along with the signal setups 1300A, 1300B of FIGS. 13A and 13B with a modification of $TE_{311}$ at 2.474 GHz. When exciting $TE_{111}$ and $TE_{211}$, the microwave input system configurations of FIGS. 20, 22, and 24 can be used along with the signal setups 2300A, 2300B of FIGS. 23A and 23B with a modification of $TE_{211}$ at 2.445 GHz.

Figure 26:
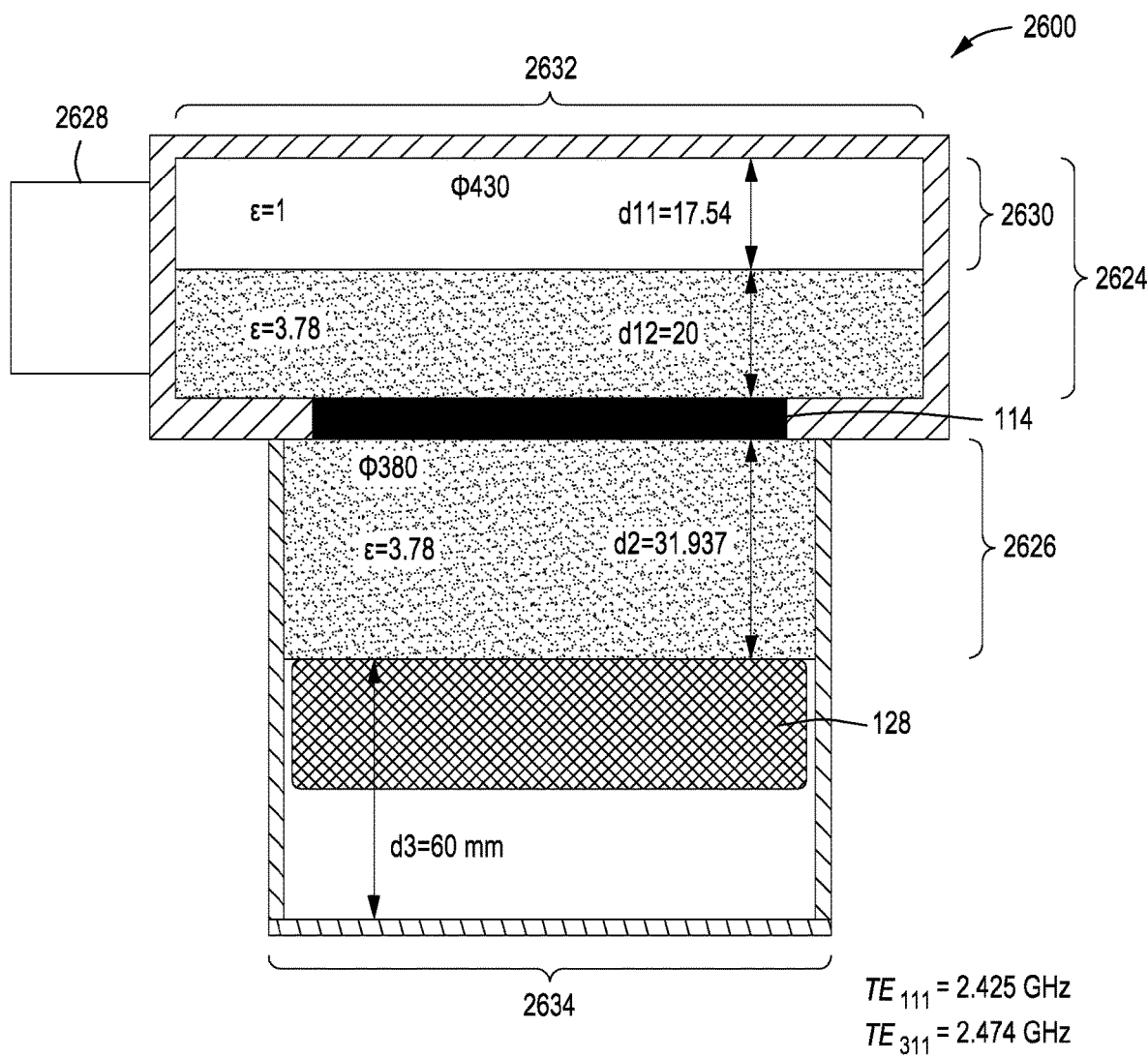
FIG. 26 is a schematic cross-sectional drawing illustrating a portion of a plasma processing system with a metallic bottom plate with radiation slots and an increased top cavity height and diameter of a waveguide in accordance with some embodiments of the present principles.

In some embodiments, the height d1 of the top cavity 2524 is increased so that the area of a power input cross-section is increased when connecting part of the top cavity 2524 with a power supplying waveguide 2528. Increasing a height of a top cavity 2624 with a power supplying waveguide 2628 can be achieved by inserting an air portion 2630 in the top cavity 2624 as shown in a microwave cavity 2600 of FIG. 26. When exciting the $TE_{111}$ and $TE_{311}$ at 2.425 and 2.474 GHz in both the top cavity 2624 and a bottom cavity 2626, a diameter 2632 of the top cavity 2624 is increased, for example, from a diameter 2634 of the bottom cavity 2626 of, for example, 380 mm to 430 mm. Besides those changes, the microwave input system configurations and signal setup are similar to the case of exciting $TE_{111}$ and $TE_{311}$ in the microwave cavity 2500 of FIG. 25.

Figure 27:
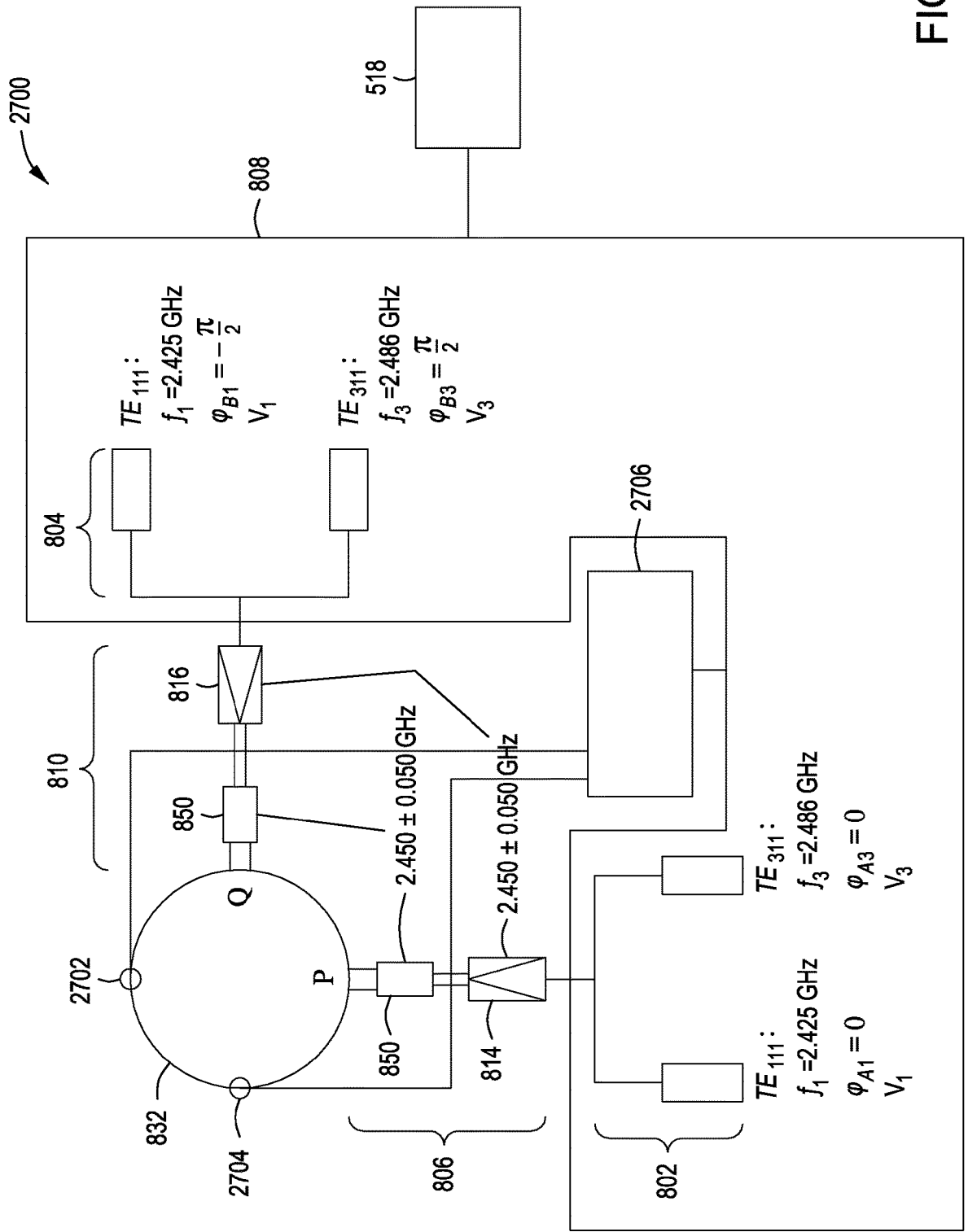
FIG. 27 is a schematic diagram of a dual microwave input system with microwave antenna feedback for providing microwaves to a plasma chamber in accordance with some embodiments of the present principles.
Figure 28:
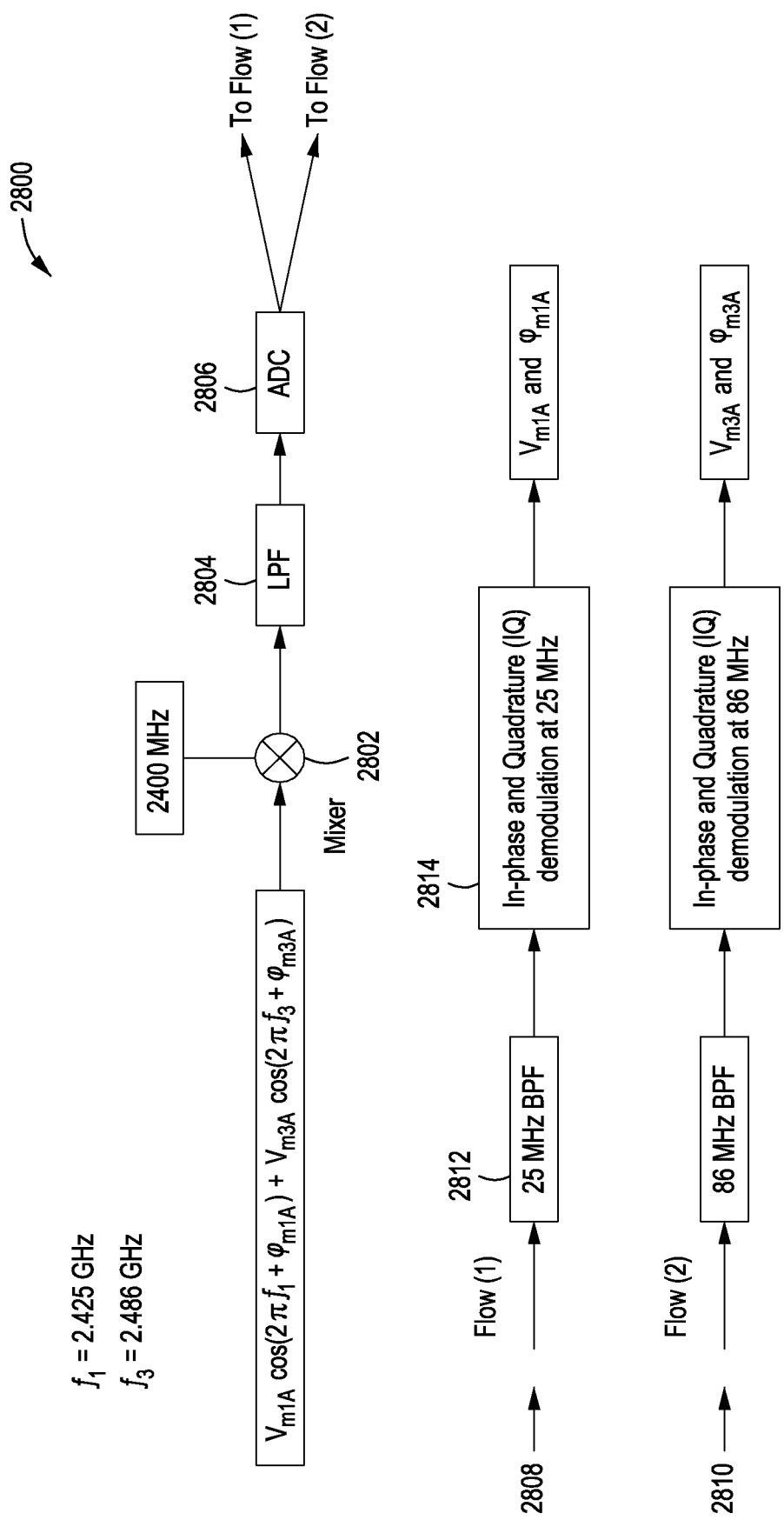
FIG. 28 is a diagram illustrating methods of extracting signal components of a detected microwave signal from a feedback source for a system providing microwaves to a plasma chamber in accordance with some embodiments of the present principles.

In some embodiments, the microwave input systems described above can employ feedback to compensate for non-uniform plasma excitation. A microwave input system 2700 of FIG. 27, corresponding to the microwave input system 800 of FIG. 8, shows two monitoring antennas A 2702 and B 2704. A signal received by the antenna A 2702, which corresponds to a microwave voltage or a current inside the microwave cavity 832, is eventually converted to a certain microwave voltage as a sum of two frequency components in the form of $V_{m1A} \cos(2\pi f_1 + \varphi_{m1A}) + V_{3mA} \cos(2\pi f_3 + \varphi_{m3A})$ where the carrier frequencies of the two modes are defined as $f_1=2.425$ GHz and $f_3=2.486$ GHz. Inside a feedback controller 2706 of FIG. 27, the signal is further sent to a mixer 2802 for frequency down-conversion as shown in a diagram 2800 of FIG. 28, followed by a Low Pass Filter (LPF) 2804 of approximately 200 MHz, eventually sent to Analog to Digital Conversion (ADC) 2806. The converted digital signal is split into two branches, Flow (1) 2808 at 25 MHz and, Flow (2) 2810 at 86 MHz branches, inversely corresponding to FIGS. 9-11. In Flow (1) 2808, the signal passes a Band Pass Filter (BPF) 2812 at 25 MHz, screening out the component of 25 MHz, corresponding to microwave at $f_1=2.425$ GHz. The signal is processed by In-phase and Quadrature (IQ) demodulation 2814 at 25 MHz, yielding the amplitude $V_{m1A}$ and phase $\varphi_{m1A}$ of the microwave component at $f_1=2.425$ GHz.

In the same manner, in Flow (2) 2810, the amplitude $V_{m3A}$ and phase $\varphi_{m3A}$ of the microwave component at $f_3=2.486$ GHz is obtained. From a signal received by Antenna B 2704, $V_{m1B}$ and $\varphi_{m1B}$ of the component of $f_1$, and $V_{m3B}$ and $\varphi_{m3B}$ of the component of $f_3$ are obtained. The phases and amplitudes can be used for feedback parameters, depending on the fast and slow rotations. The targeted parameters are, in the case of the anti-clockwise slow rotation, $\varphi_{m1B} - \varphi_{m1A} = 0$, $V_{m1A} \propto \cos(\Omega t + \alpha)$, $$V_{m1B} \propto \cos\left(\Omega t - \frac{\pi}{2} + \alpha\right),$$

and $\varphi_{m3B} - \varphi_{m3A} = 0$, $V_{m3A} \propto \cos(\Omega t + \beta)$, $$V_{m3B} \propto \cos\left(\Omega t - \frac{3\pi}{2} + \beta\right).$$

In the case of the anti-clockwise fast rotation, $$\varphi_{m1B} - \varphi_{m1A} = -\frac{\pi}{2},$$

$V_{m1A} = V_{m1B}$, and $$\varphi_{m1B} - \varphi_{m1A} = -\frac{3\pi}{2},$$

$V_{m3A} = V_{m3B}$. Those targeted values can be obtained by adjusting the amplitudes and phases of each carrier frequency ($f_1$ and $f_3$) along with the negative feedback such as proportional-integral-derivative (PID) controller.

Figure 29:
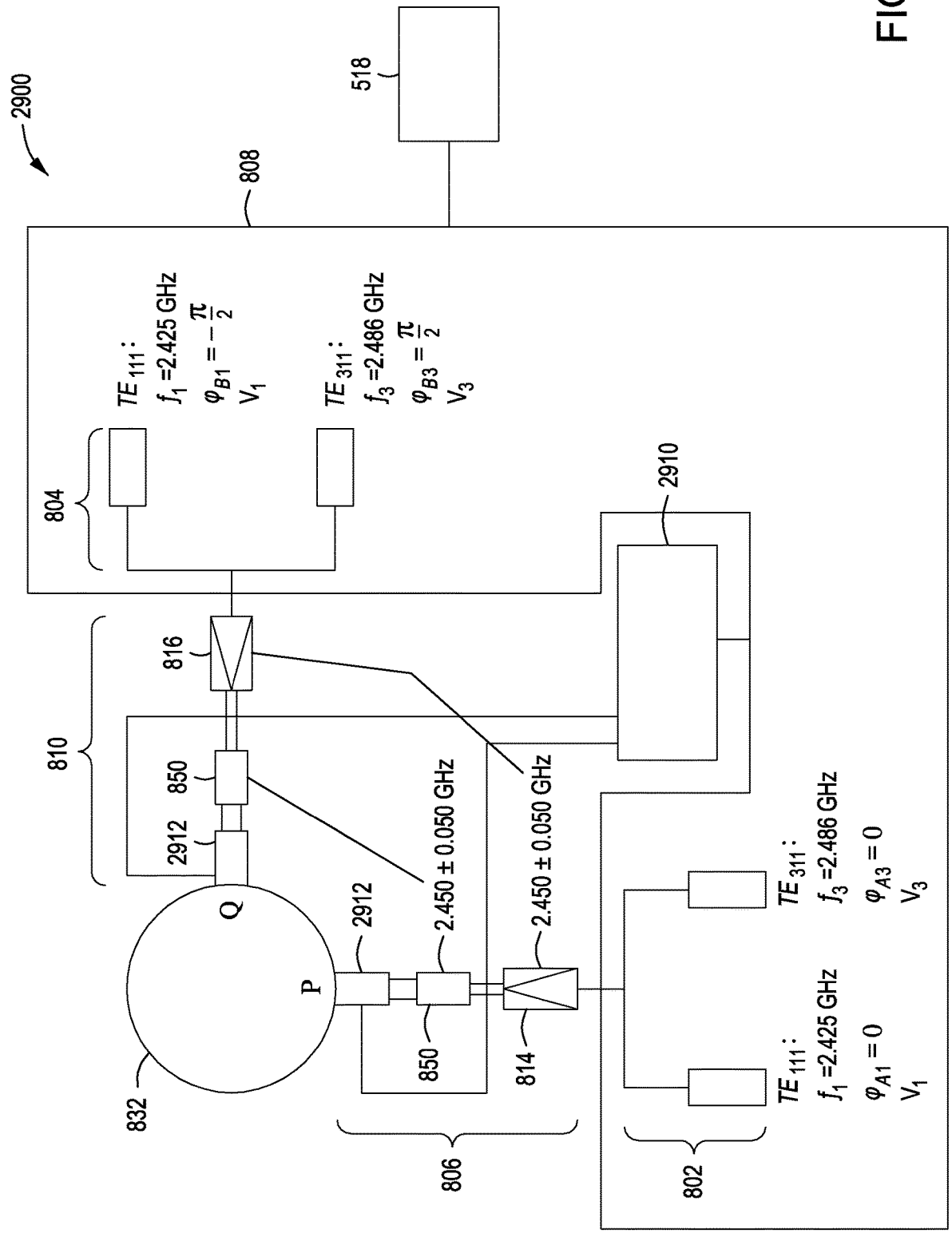
FIG. 29 is a schematic diagram of a dual microwave input system with microwave directional coupler feedback for providing microwaves to a plasma chamber in accordance with some embodiments of the present principles.

In some embodiments with feedback, a microwave input system 2900 includes a microwave directional coupler 2912 shown in FIG. 29 that is used post tuner 850 at each input port P, Q and sends information to the feedback controller 2910. Either the forward or reflect port on the microwave directional coupler 2912 can be used for monitoring. The monitoring method and theory are the similar to those illustrated for FIGS. 27 and 28. In addition, some embodiments, can incorporate feedback from effects found on a wafer after processing. For example, subsequent to a deposition process, testing of the uniformity of a deposited film on a wafer can be checked and the testing results can be input into the feedback system of the microwave input system to further improve the plasma uniformity.

Figure 30:
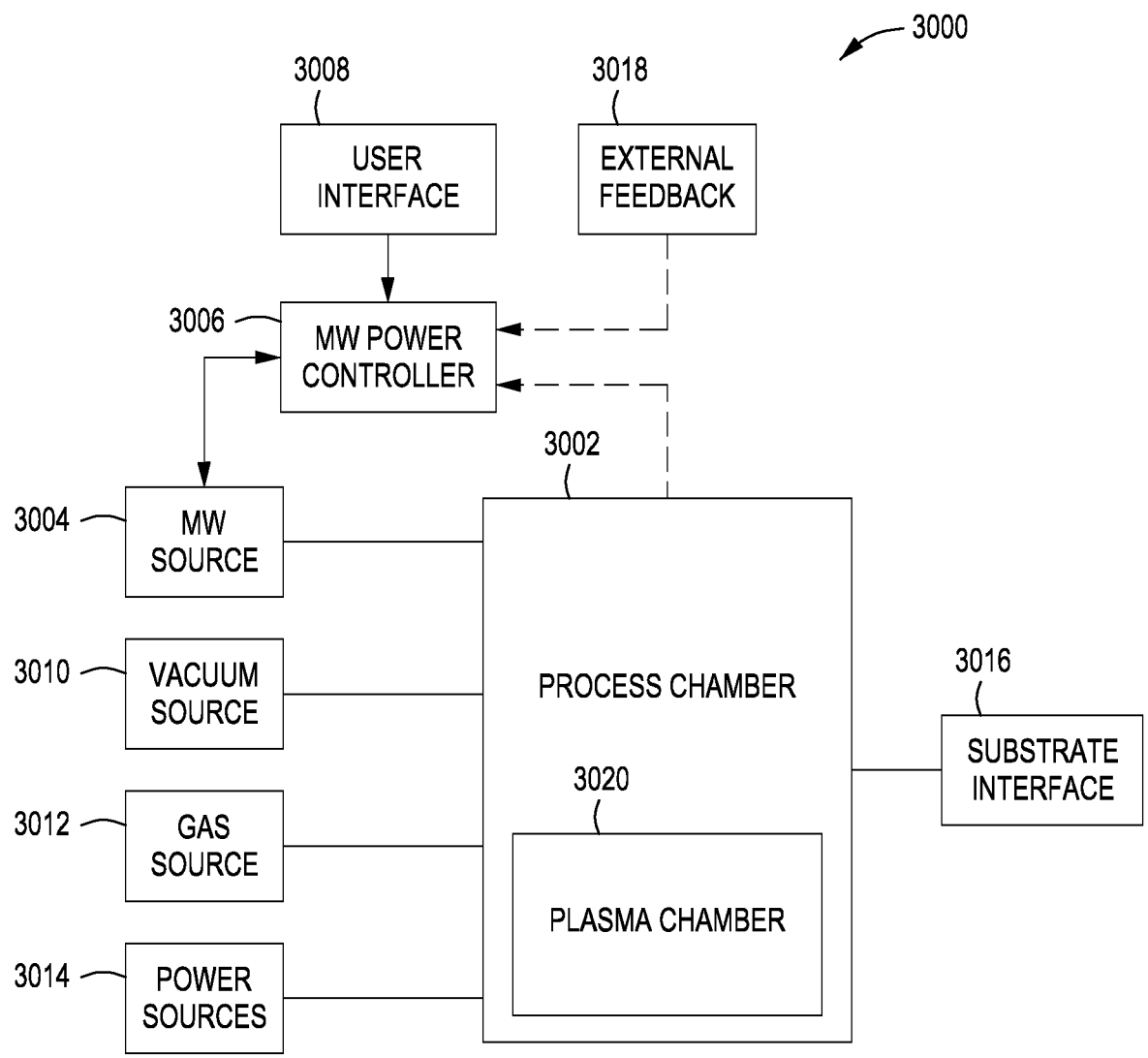
FIG. 30 is a schematic diagram of a plasma chamber with microwave inputs for plasma generation in accordance with some embodiments of the present principles.

FIG. 30 is a schematic diagram 3000 of a process chamber 3002 having a plasma chamber 3020 and microwave inputs for plasma generation in accordance with some embodiments. The process chamber 3002 has interfaces with microwave sources 3004, vacuum source 3010, gas sources 3012, power sources 3014, and a substrate interface 3016. A microwave power controller 3006 interfaces with the microwave sources 3004 to control the microwave input to control plasma generated in the plasma chamber 3020. The microwave power controller 3006 may also interface with the process chamber 3002 or the plasma chamber 3020 to receive feedback from the microwave input and/or from a resultant parameter of the processing (such as film uniformity and the like).

The microwave power controller 3006 may also interface with external devices and/or processes to receive external feedback 3018 regarding the uniformity of the processes of the plasma chamber 3020. The microwave power controller 3006 can also have a user interface 3008 to receive input regarding parameters or other processing changes regarding the microwave inputs. The microwave power controller 3006 may also compensate power ratios for different processes, gases, pressures, and/or physical changes of the process chamber 3002 over time (deposition build-up, etc.). The microwave power controller 3006 may also adjust the power ratio to compensate for performance of components involved in the delivery of the microwave inputs such as tuners, amplifiers, transmission lines, waveguides, and/or power combiners, etc. The microwave power controller 3006 may operate manually with an operator's input and/or automatically based on settings or feedback. The substrate interface 3016 allows for substrates/wafers to be loaded into and out of the plasma chamber 3020.

The vacuum source 3010 permits evacuation of process gases and also a reduction in pressure when required during processing. Gas sources 3012 provide process gases and other gases used for processing or cleaning/evacuation of the plasma chamber 3020. Power sources 3014 may include radio frequency (RF) biasing power and the like as required by the processes.

While the foregoing is directed to embodiments of the present principles, other and further embodiments of the principles may be devised without departing from the basic scope thereof.

The invention claimed is:

1. A system for generating plasma for a semiconductor process, comprising:
   a process chamber having a microwave cavity for producing plasma;
   a plurality of microwave inputs connected via side inputs to the microwave cavity;
   a microwave signal generator connected to the microwave cavity via at least one set of an amplifier and a tuner;

the microwave signal generator supplying a plurality of microwave signals to the plurality of microwave inputs, wherein the plurality of microwave signals generates a plurality of eigenmodes within the microwave cavity; and a microwave power controller in direct communication with the microwave signal generator and configured to automatically adjust a power ratio between two of the plurality of eigenmodes generated in the microwave cavity by at least two of the plurality of microwave signals transmitted into the microwave cavity as separate, independent microwave inputs each generating a different one of the plurality of eigenmodes such that plasma generated in the process chamber by the plurality of eigenmodes is radially uniform.

2. The system of claim 1, further comprising:
a feedback controller connected to the process chamber to detect at least one microwave signal in the microwave cavity.

3. The system of claim 1, wherein the microwave signal generator creates a first microwave signal from a first mode and a second mode and a second microwave signal from the first mode and the second mode.

4. The system of claim 3, wherein the microwave signal generator alternately pulses the first microwave signal and the second microwave signal.

5. The system of claim 3, wherein the first mode is one of an edge-high mode and a center-high mode and the second mode is one of an edge-high mode and a center-high mode.

6. The system of claim 5, wherein the microwave signal generator creates at least one of the first microwave signal and the second microwave signal from at least one edge-high mode and at least one center-high mode.

7. The system of claim 1, wherein the microwave signal generator is connected to a plurality of microwave inputs of the microwave cavity via a plurality of sets of amplifiers and tuners and supplies the plurality of microwave signals to the plurality of microwave inputs.

8. The system of claim 7, further comprising:
a feedback controller connected to the process chamber to detect at least one microwave signal in the microwave cavity.

9. The system of claim 7, further comprising:
a microwave power combiner connected between a plurality of amplifiers and a tuner.

10. The system of claim 7, wherein the microwave signal generator creates at least one first microwave signal from at least one of a first mode and a second mode and at least one second microwave signal from at least one of a first mode and a second mode.

11. The system of claim 10, wherein the first mode is one of an edge-high mode and a center-high mode and the second mode is one of an edge-high mode and a center mode.

12. The system of claim 11, wherein the microwave signal generator creates at least one microwave signal from at least one edge-high mode and at least one center-high mode.

* * * * *

UNITED STATES PATENT AND TRADEMARK OFFICE
CERTIFICATE OF CORRECTION

PATENT NO. : 11,355,317 B2
APPLICATION NO. : 16/218848
DATED : June 7, 2022
INVENTOR(S) : Kobayashi et al.

It is certified that error appears in the above-identified patent and that said Letters Patent is hereby corrected as shown below:

In the Specification

Column 8, Line 45, delete "$\varphi'_{ant} = \frac{5\pi}{2} = -\frac{\pi}{2}$" and insert -- $\varphi'_{ant} = \frac{5\pi}{2} = \frac{\pi}{2}$ --

Column 8, Line 55, delete "$\varphi_{ant} = -\frac{\pi}{2}$, and $\varphi'_{ant} = \frac{\pi}{2}$" and insert -- $\theta_q = \frac{\pi}{2}$ --

Column 8, Line 60, delete "$\theta_q = \frac{\pi}{2}$" and insert -- $\varphi_{ant} = -\frac{\pi}{2}$, and $\varphi'_{ant} = \frac{\pi}{2}$, --

Signed and Sealed this
Nineteenth Day of July, 2022

Katherine Kelly Vidal
*Director of the United States Patent and Trademark Office*